(12) United States Patent
Shohet et al.

(10) Patent No.: US 8,199,507 B2
(45) Date of Patent: Jun. 12, 2012

(54) TELEPHONY AND DIGITAL MEDIA SERVICES DEVICE

(75) Inventors: Yuval Shohet, Acton, MA (US); Teerapat Theerawong, Delray Beach, FL (US)

(73) Assignee: OpenPeak Inc., Boca Raton, FL (US)

( * ) Notice: Subject to any disclaimer, the term of this patent is extended or adjusted under 35 U.S.C. 154(b) by 91 days.

(21) Appl. No.: 12/639,175

(22) Filed: Dec. 16, 2009

(65) Prior Publication Data

US 2010/0157543 A1 Jun. 24, 2010

Related U.S. Application Data

(60) Provisional application No. 61/139,090, filed on Dec. 19, 2008.

(51) Int. Cl.
*H05K 7/20* (2006.01)

(52) U.S. Cl. .............. 361/710; 361/679.22; 361/646; 361/676; 361/752; 174/252; 174/548; 312/223.1

(58) Field of Classification Search ............... None
See application file for complete search history.

(56) References Cited

U.S. PATENT DOCUMENTS

| | | | |
|---|---|---|---|
| 5,872,699 A * | 2/1999 | Nishii et al. ............... 361/699 |
| 6,084,769 A * | 7/2000 | Moore et al. ............ 361/679.47 |
| 6,104,451 A * | 8/2000 | Matsuoka et al. ............ 349/58 |
| 6,181,553 B1 * | 1/2001 | Cipolla et al. ........... 361/679.54 |
| 6,223,815 B1 | 5/2001 | Shibasaki |
| 6,276,448 B1 * | 8/2001 | Maruno ..................... 165/185 |
| 6,449,149 B1 * | 9/2002 | Ohashi et al. ............ 361/679.46 |
| 6,457,030 B1 | 9/2002 | Adams et al. |
| 6,674,640 B2 * | 1/2004 | Pokharna et al. ........ 361/679.48 |
| 7,058,088 B2 | 6/2006 | Tomita et al. |
| 7,130,193 B2 * | 10/2006 | Hirafuji et al. ............... 361/700 |
| 7,301,767 B2 * | 11/2007 | Takenoshita et al. ........ 361/695 |
| 7,778,035 B2 * | 8/2010 | Huang et al. .................. 361/713 |
| 2002/0013852 A1 | 1/2002 | Janik |
| 2003/0090864 A1 * | 5/2003 | Kuo ........................... 361/683 |
| 2004/0060687 A1 | 4/2004 | Moss |
| 2004/0078812 A1 | 4/2004 | Calvert |
| 2004/0190256 A1 * | 9/2004 | Genova et al. ............... 361/703 |

(Continued)

FOREIGN PATENT DOCUMENTS

| | | |
|---|---|---|
| WO | 2010080498 A1 | 7/2010 |
| WO | 2010080500 A1 | 7/2010 |

OTHER PUBLICATIONS

International Search Report and Written Opinion for International Appl. No. PCT/US09/068475 dated Apr. 23, 2010, 17 pages.

(Continued)

*Primary Examiner* — Courtney Smith
(74) *Attorney, Agent, or Firm* — Fiala & Weaver P.L.L.C.

(57) ABSTRACT

An electronic device includes a housing, a printed circuit board, a first heat sink and a second heat sink. The printed circuit board is disposed internal to the housing and supports at least one integrated circuit (IC) chip. The first heat sink is also disposed internal to the housing and is thermally connected to the at least one IC chip. The second heat sink is connected to the housing such that at least a portion thereof is externally disposed to the housing. The second heat sink is thermally connected to the first heat sink via an aperture in the housing.

12 Claims, 25 Drawing Sheets

U.S. PATENT DOCUMENTS

| | | |
|---|---|---|
| 2005/0131885 A1 | 6/2005 | Komatsu et al. |
| 2005/0144445 A1 | 6/2005 | Yeap et al. |
| 2005/0213331 A1 | 9/2005 | Lewis |
| 2006/0200658 A1 | 9/2006 | Penkethman |
| 2007/0169105 A1 | 7/2007 | Amberny et al. |
| 2007/0183772 A1* | 8/2007 | Baldwin et al. ............... 396/439 |
| 2008/0070495 A1 | 3/2008 | Stricklen et al. |
| 2008/0125079 A1 | 5/2008 | O'Neil et al. |
| 2010/0157989 A1 | 6/2010 | Krzyzanowski et al. |
| 2010/0157990 A1 | 6/2010 | Krzyzanowski et al. |
| 2010/0159898 A1 | 6/2010 | Krzyzanowski et al. |
| 2011/0038120 A1 | 2/2011 | Merz et al. |

OTHER PUBLICATIONS

International Search Report and Written Opinion for International Appl. No. PCT/US09/68482 dated Feb. 23, 2010, 12 pages.

* cited by examiner

TELEPHONY AND DIGITAL MEDIA SERVICES DEVICE

CROSS-REFERENCE TO RELATED APPLICATIONS

This application claims priority to U.S. Provisional Patent Application No. 61/139,090, filed Dec. 19, 2008, the entirety of which is incorporated by reference herein.

BACKGROUND OF THE INVENTION

1. Field of the Invention

The present invention relates to systems, methods, and apparatuses that facilitate access to telephony and digital media services.

2. Background

The traditional home or office telephone typically provides a very limited set of functions related almost entirely related to telephony. Users wishing to perform functions that extend beyond the basic feature set of a home/office telephone are required to utilize one or more other devices or platforms. For example, users of traditional home/office telephones typically have to use a printed phonebook or a separate computer to access directory services information. Traditional home/office telephones also do not provide access to a variety of Internet Protocol (IP) network-based applications and services, advanced media applications and graphics, or standard computer-based functions such as a contacts database, directory, instant messaging, calendar, news and weather.

BRIEF SUMMARY OF THE INVENTION

A system, method and apparatus for providing telephony and digital media services to a location, such as a home or office, is described herein. The system includes a telephony and digital media services device that is configured to function as a voice, data and media information center. The device provides telephony functionality both directly and through associated handsets. The device pairs a user-friendly touchscreen interface with a high-performance hardware/software architecture capable of delivering advanced media applications and graphics combined with landline quality telephony service all in one integrated system.

Various aspects of the present invention will be described in further detail herein. Such aspects include but are not limited to device and handset design. For example, an electronic device in accordance with one embodiment of the present invention includes a housing, a printed circuit board, a first heat sink and a second heat sink. The printed circuit board is disposed internal to the housing and supports at least one integrated circuit (IC) chip. The first heat sink is also disposed internal to the housing and is thermally connected to the at least one IC chip. The second heat sink is connected to the housing such that at least a portion thereof is externally disposed to the housing. The second heat sink is thermally connected to the first heat sink via an aperture in the housing.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
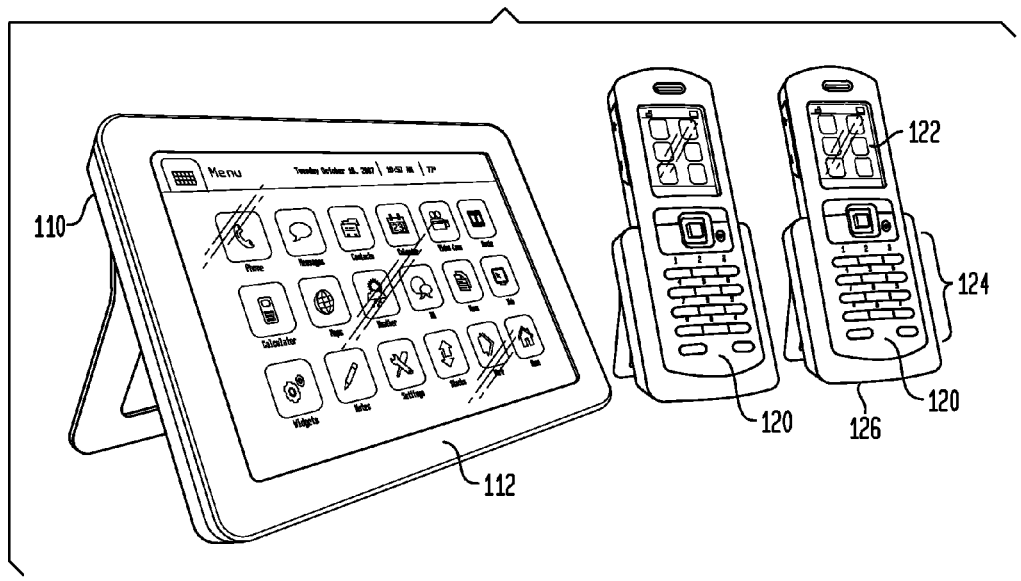
FIG. 1 depicts elements of a system for providing telephony and digital media services to a location, such as a home or office, in accordance with an embodiment of the invention.

Applicants expressly disclaim any rights to any third-party trademarks or copyrighted images included in the figures. Such marks and images have been included for illustrative purposes only and constitute the sole property of their respective owners.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

I. Introduction

The following detailed description refers to the accompanying drawings that illustrate exemplary embodiments of the present invention. However, the scope of the present invention is not limited to these embodiments, but is instead defined by the appended claims. Thus, embodiments beyond those shown in the accompanying drawings, such as modified versions of the illustrated embodiments, may nevertheless be encompassed by the present invention.

References in the specification to "one embodiment," "an embodiment," "an example embodiment," or the like, indicate that the embodiment described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of one skilled in the art to implement such feature, structure, or characteristic in connection with other embodiments whether or not explicitly described.

II. Example System for Providing Telephony and Digital Media Services

FIG. 1 depicts elements of a system 100 for providing telephony and digital media services to a location, such as a home or office, in accordance with an embodiment of the present invention. As used herein, the term "digital media services" broadly refers to any service that is based on the transfer and/or presentation of digital content to a user. As shown, in FIG. 1, system 100 includes a telephony and digital media services device ("device") 110 and associated handsets 120.

As shown in FIG. 1, device 110 includes a display 112. Display 112 is used to provide a graphical user interface (GUI) that enables a user to initiate, manage and experience telephony and digital media services provided by system 100. In one embodiment, display 112 comprises a color LCD display with a capacitive touch screen panel. In such an embodiment, a user may interact with the GUI by touching display 112 with a finger.

Handsets 120 provide a means for extending the telephony services, and optionally other services, of device 110 to other areas within a given location, such as to other areas within a home or office. As shown in FIG. 1, each handset 120 includes a user interface that comprises both a display 122, such as a color LCD display, and a keypad 124. Each handset 120 may be placed in a corresponding docking station 126. Docking station 126 provides an interface by which a battery internal to a handset may be recharged and also provides a means for supporting a handset when it is not in use.

Handsets 120 are configured to wirelessly communicate with device 110 for the purposes of providing telephony services and to optionally provide other services to a user. In one embodiment, such communications are carried out in accordance with the Digital Enhanced Cordless Telecommunications (DECT) standard published by the European Telecommunications Standards Institute (ETSI). Thus, in one embodiment, device 110 is configured to act as a DECT base station and handsets 120 are configured to act as DECT handsets. Other communication configurations will be discussed elsewhere herein.

Figure 2:
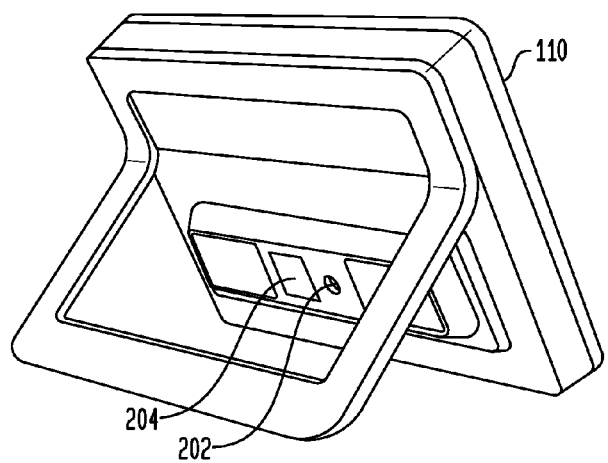
FIG. 2 is a back perspective view of a telephony and digital media services device in accordance with an embodiment of the invention.

FIG. 2 is a back perspective view of device 110. As shown in FIG. 2, device 110 includes an interface 202 for connecting to a power supply, such as an AC adapter as well as an interface 204 for connecting to a network, such as a local area network or wide area network. In one embodiment, interface 204 comprises an Ethernet interface, such as a 10/100/1000 megabit per second (Mbps) Ethernet interface. Device 110 may also include an internal wireless network adapter, such as an 802.11 wireless network adapter, for providing network connectivity. As will be described in more detail herein, such network connectivity may be utilized by device 110 for providing telephony services and/or certain digital media services to a user.

Example implementation details concerning handset 120 will now be provided. As discussed above in reference to FIG. 1, each handset 120 includes a user interface that comprises both a display 122 and a keypad 124. In an embodiment, display 122 comprises a 2 in. (5.1 mm) 18-bit color TFT LCD display having an active viewing area of 31.68 mm×39.6 mm, a pixel format of 176×220 pixels, a pixel size of 0.18 mm×0.18 mm, LED backlighting, and a maximum brightness of 350 cd/m². Keypad 124 comprises a standard telephone keypad including 10 numbers, "*" and "#" keys. In an embodiment, each key is implemented using a pressure membrane switch that is responsive to 180 grams of pressure.

Figure 3:
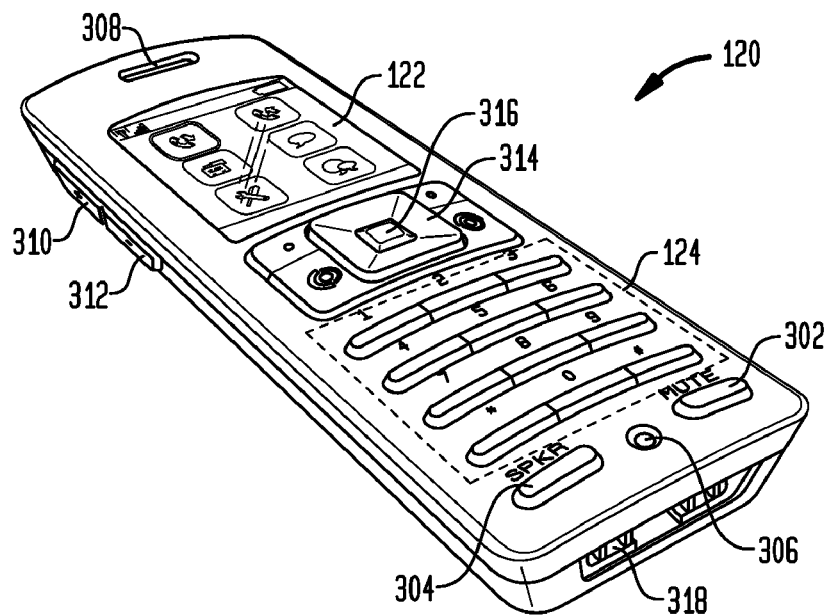
FIG. 3 is a front perspective view of a handset in accordance with an embodiment of the present invention.

As shown in FIG. 3, handset 120 further comprises user interface navigation controls in the form of a 4-way scroll pad 314 and a selection/activation button 316 (also referred to as an "OK" button).

Figure 4:
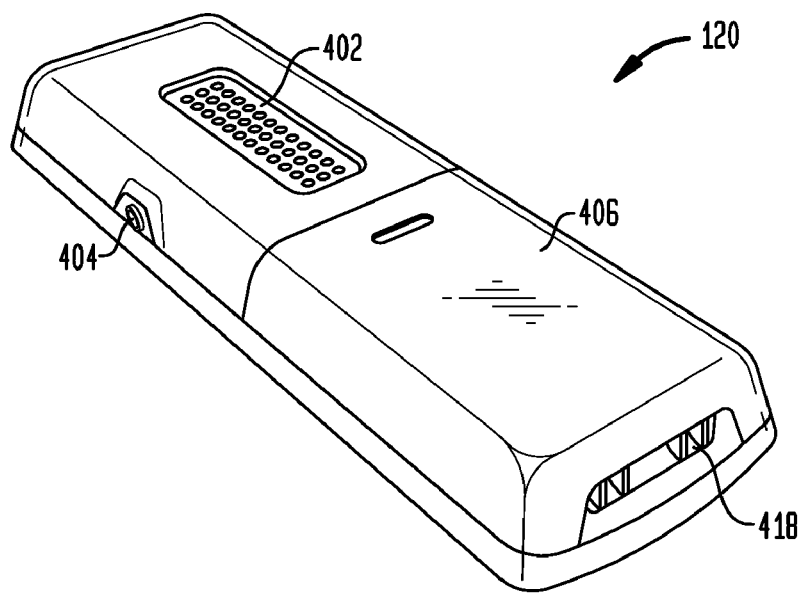
FIG. 4 is a back view of a handset in accordance with an embodiment of the present invention.

As further shown in FIG. 3, handset 120 includes a microphone 306 and speaker 308 for conducting a telephone call in a normal mode. As shown in FIG. 4, handset 120 also includes a rear-facing speaker 402 for conducting a phone call in a speakerphone mode. A speakerphone button 304 is provided for activating the speakerphone mode. An earpiece and microphone connector 404 is provided for plugging in a wired headset. To control speaker volume, a "volume up" button 310 and a "volume down" button 312 are provided on one side of handset 120. A mute button 302 is also provided to turn off microphone 306 during a telephone call.

Figure 5:
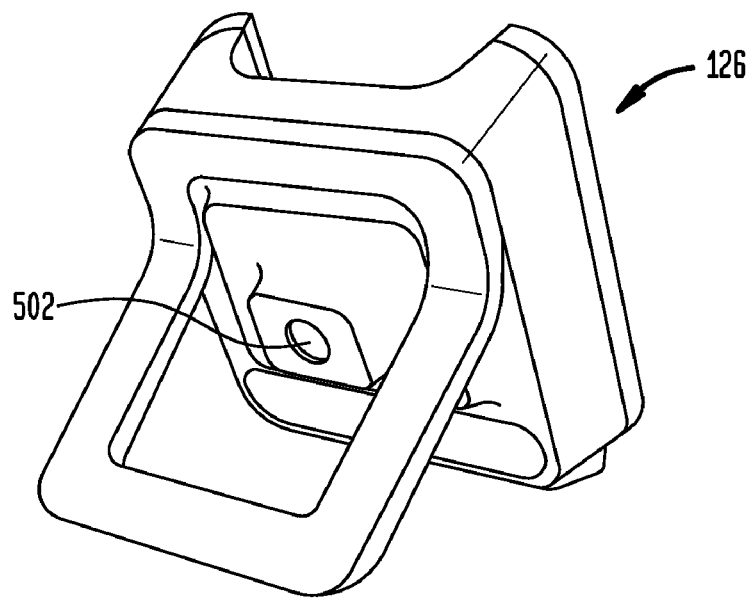
FIG. 5 is a front perspective view of a handset docking station in accordance with an embodiment of the present invention.
Figure 6:
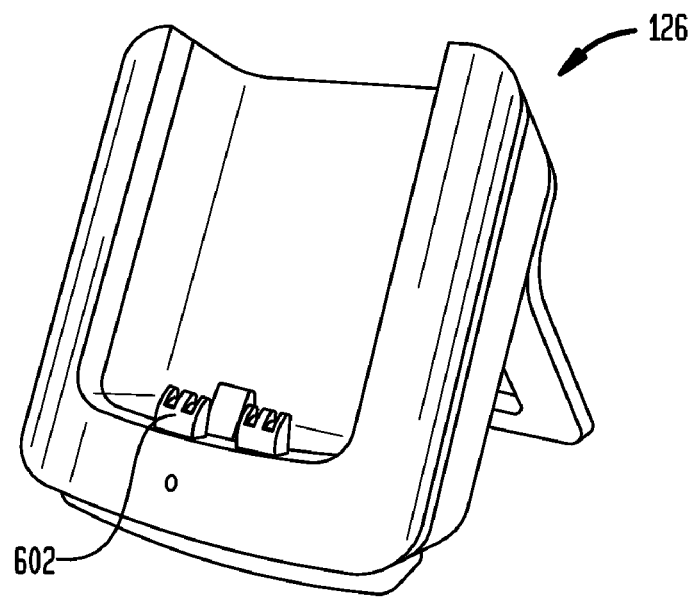
FIG. 6 is a back perspective view of a handset docking station in accordance with an embodiment of the present invention.

Handset charging contacts 318 are provided at the bottom of handset 120. When handset 120 is placed in a corresponding docking station 126 (as shown in FIGS. 1, 5 and 6), handset charging contacts 318 come into contact with docking station charging contacts 602. This allows docking station 126 to charge a battery internal to handset 120. In one embodiment, the battery internal to handset 120 comprises a 550 mAh Lithium-Ion battery. The battery is accessible for replacement via a removable back plate 406. Docking station 126 also includes a connector 502 for receiving power via an AC adapter. In one embodiment, the AC adapter comprises a 5V/500 milliampere-hour (mAh) AC adapter.

As described above, in one embodiment, handset 120 is configured to act as a DECT client that wirelessly communicates with device 110 which acts as a DECT base station. In accordance with such an embodiment, handset 120 may include DECT firmware that supports features such as two- or three-party conferencing, an enhanced graphical user interface, uploadable ringtones (e.g., MIDI and MP3), a synchronized address book, and remotely managed firmware upgrades.

The foregoing provides by way of introduction only a brief description of certain implementations of device 110 and handsets 120 that comprise a portion of telephony and digital media service delivery system 100. Additional details concerning such implementations, as well as various alternative implementations, will be described in detail herein.

III. Design Aspects and Considerations

III.A. Exemplary Device Design

Figure 7:
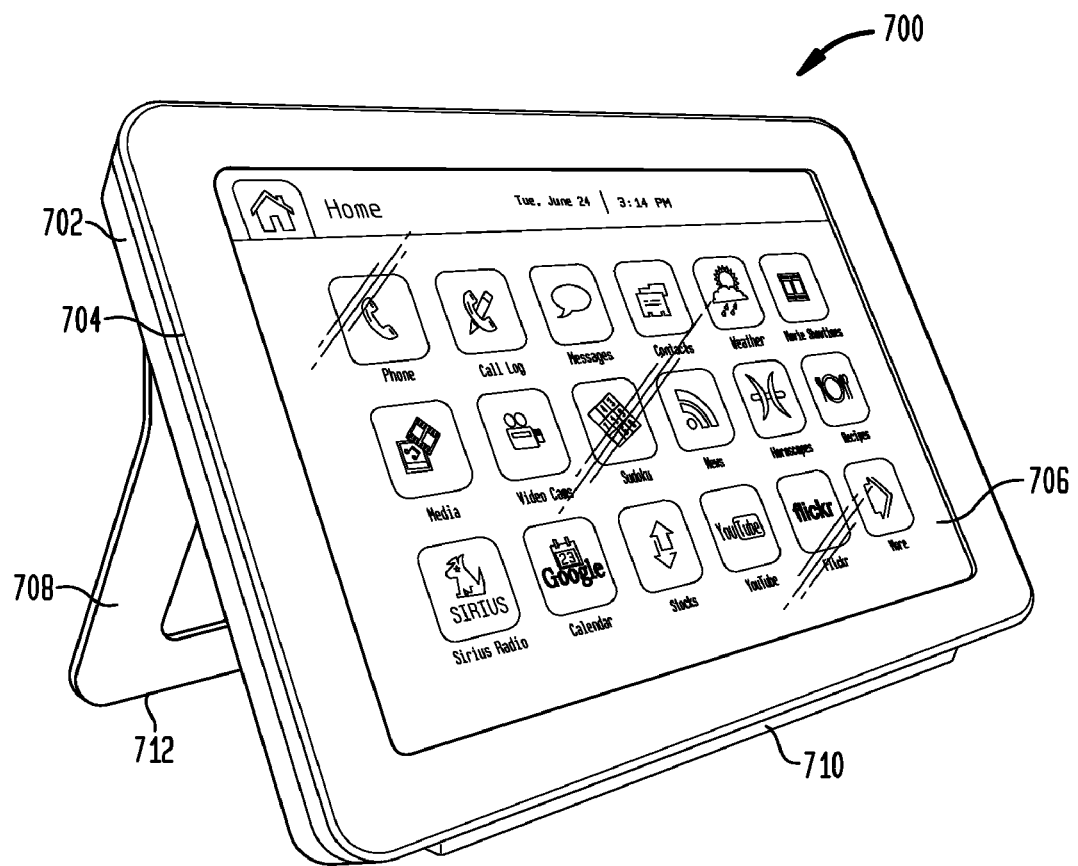
FIG. 7 is a front perspective view of a telephony and digital media services device in accordance with an embodiment of the present invention.
Figure 8:
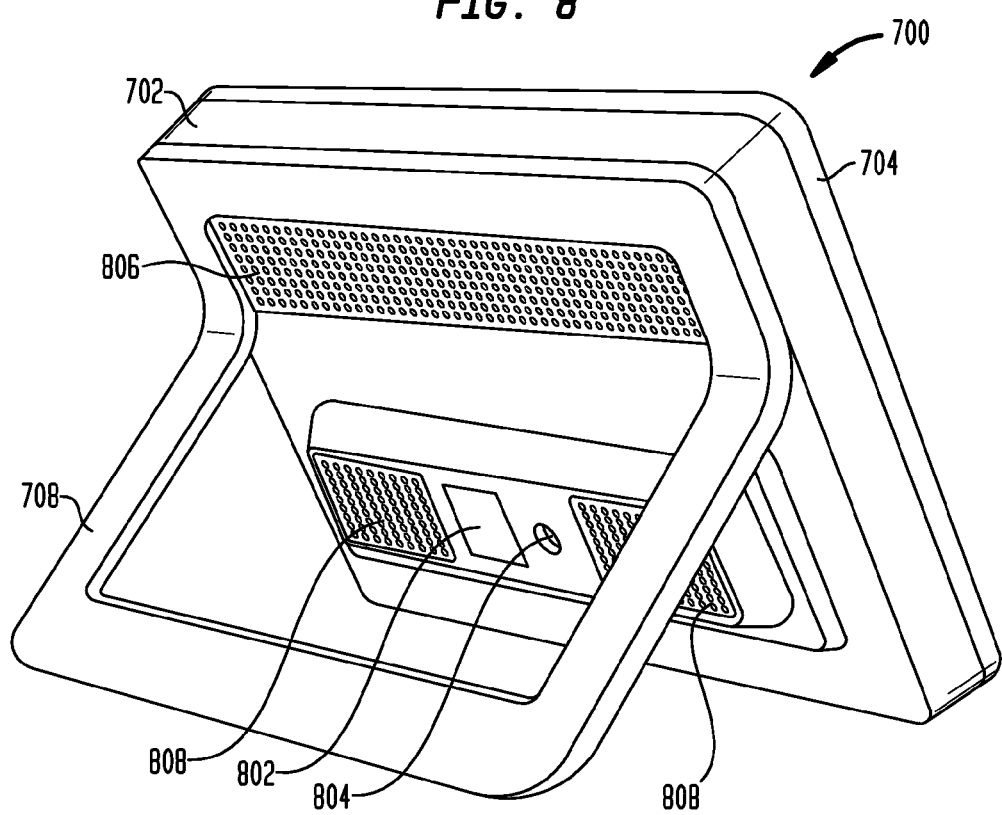
FIG. 8 is a back perspective view of a telephony and digital media services device in accordance with an embodiment of the present invention.
Figure 9:
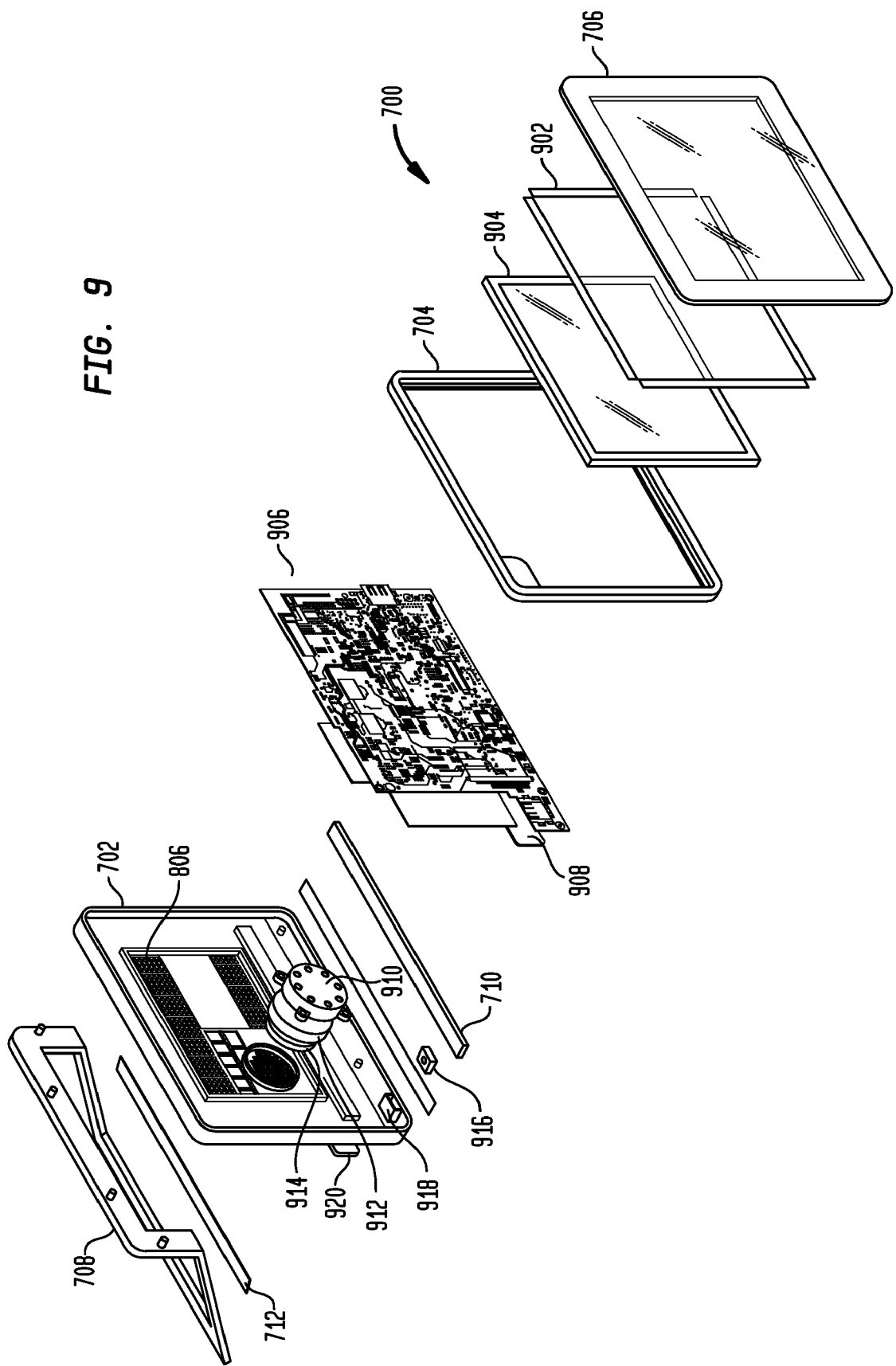
FIG. 9 is a front perspective exploded view of a telephony and digital media services device in accordance with an embodiment of the present invention.
Figure 10:
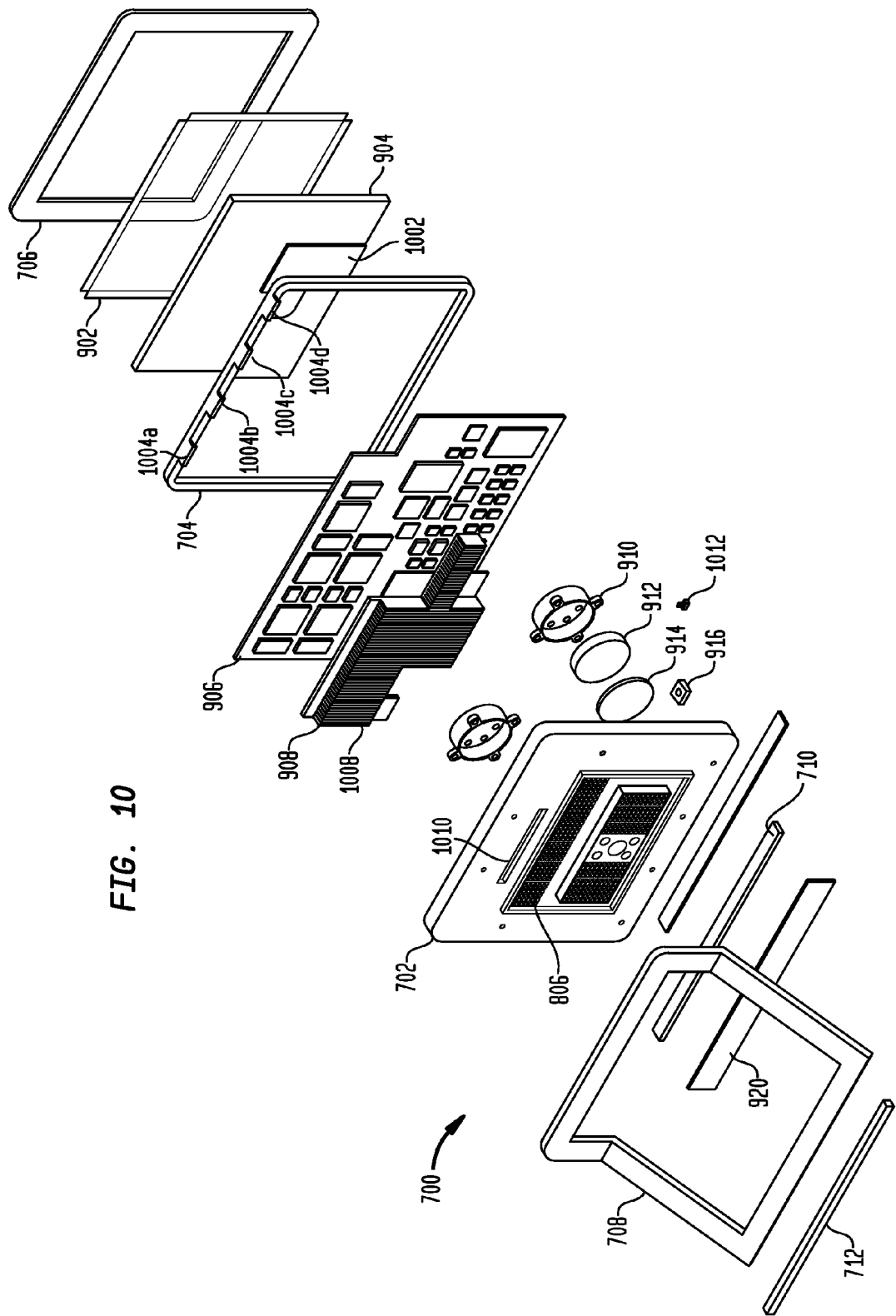
FIG. 10 is a back perspective exploded view of a telephony and digital media services device in accordance with an embodiment of the present invention.
Figure 11:
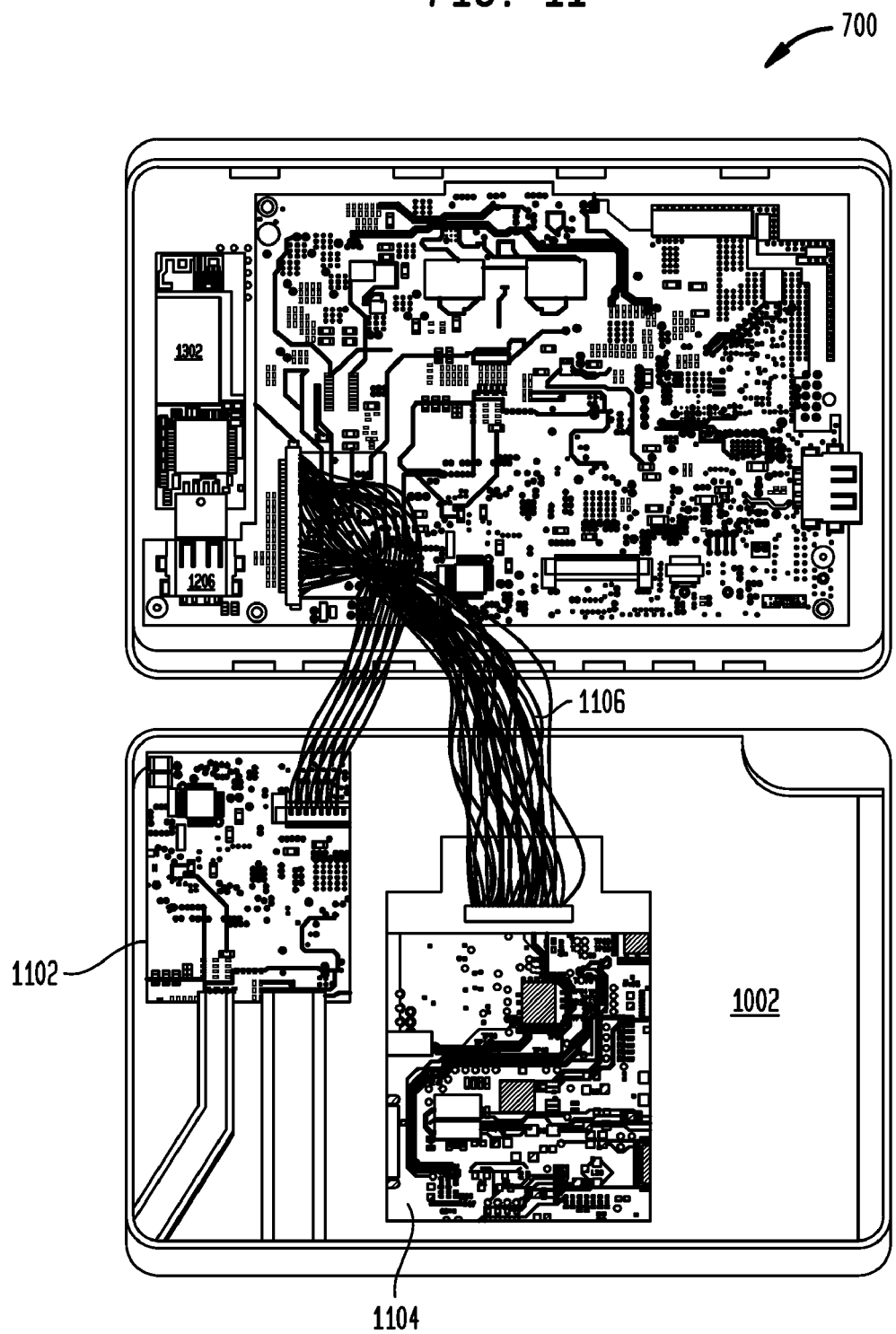
FIGS. 11-13 are perspective views of an interior portion of a telephony and digital media services device in accordance with an embodiment of the present invention.
Figure 12:
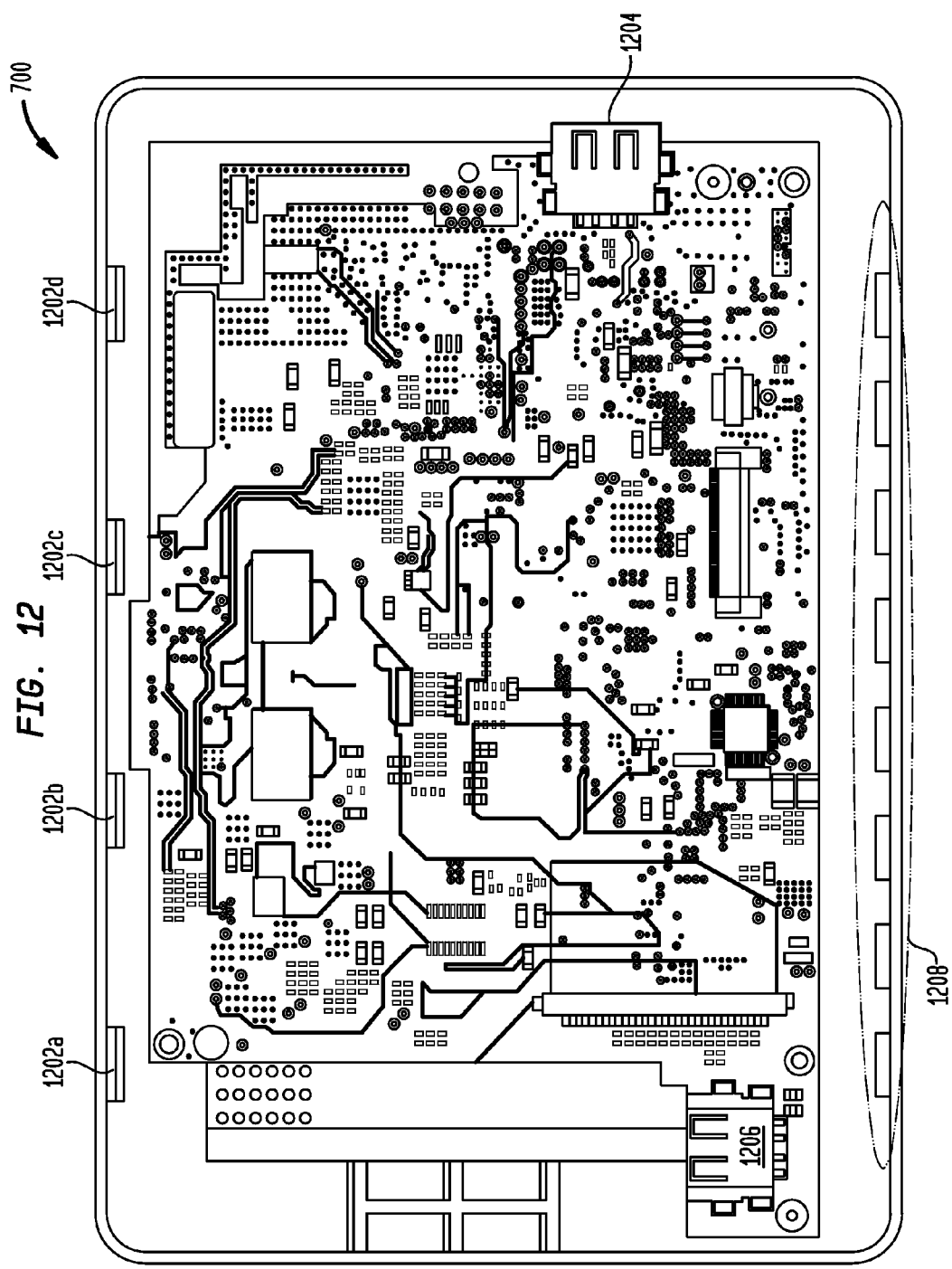
Figure 13:
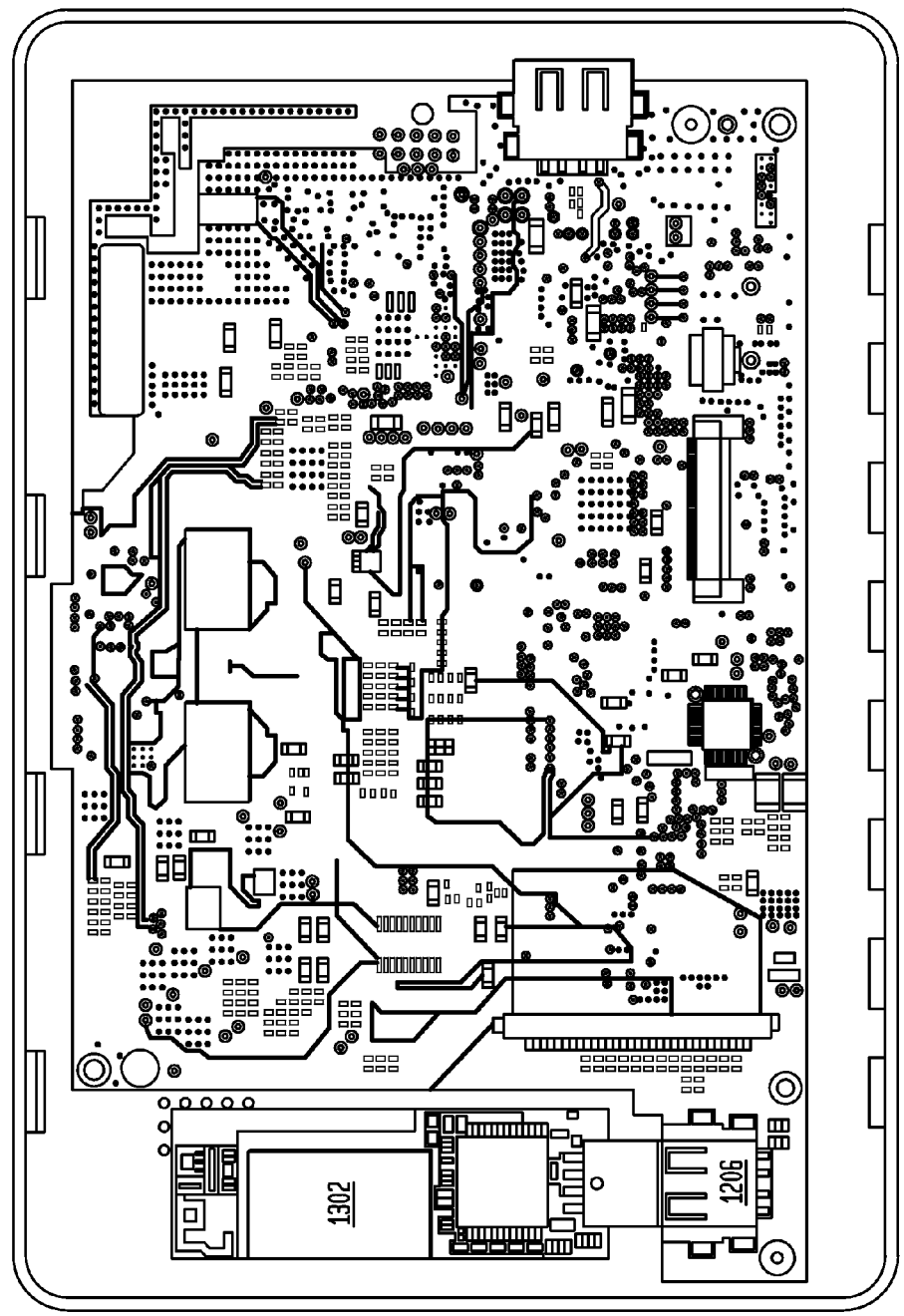

The design of an exemplary telephony and digital media services device 700 will now be described in reference to FIGS. 7-13. FIGS. 7 and 8 are front and back perspective views of device 700 respectively while FIGS. 9 and 10 are front and back perspective exploded views of device 700 respectively. FIGS. 11-13 provide perspective views of the interior of device 700.

Device 700 includes a housing that comprises a rear housing 702, a frame-shaped front housing (or bezel) 704 and a glass panel 706. In an embodiment, rear housing 702 and front housing 704 are each formed from an industrial thermoplastic material selected for durability and stability. For example, in one embodiment rear housing 702 is formed from ABS (acrylonitrile/butadiene/styrene) while front housing 704 is formed from polycarbonate (PC)/ABS, although these are only examples.

Glass panel 706 is firmly secured to front housing 702 using a very high bond (VHB) tape 902. Together, front housing 704 and glass panel 706 provide an enclosure in which is housed an integrated capacitive touch panel and LCD display 904. Glass panel 706 provides a clear and durable interface to touch panel/LCD display 904 that can be cleaned using a variety of common household cleaning agents. In an embodiment, glass panel 706 comprises a panel of 1.09 mm thick chemically-strengthened glass with a painted black border on the interior side.

Details concerning touch panel/LCD display 904 have been provided elsewhere herein. In an embodiment, a programmable system on chip (PSOC) controller that is electrically connected to the capacitive touch panel resides on a first daughterboard 1102 that is affixed to a rear side 1002 of touch panel/LCD display 904 and an LCD controller that is electrically connected to the LCD display resides on a second daughterboard 1104 that is also affixed to rear side 1002 of touch panel/LCD display 904.

Rear housing 702 includes openings that accommodate an external RJ45 jack 802 for providing Ethernet connectivity and a connector 804 for an AC power supply.

During assembly, front housing 704 is securely fastened to rear housing 702 by inserting a plurality of hooks 1004a-1004d that extend from a rear portion of front housing 704 underneath corresponding ridges 1202a-1202d extending from a top interior portion of rear housing 702 and then by fastening a bottom portion of front housing 704 to a bottom portion of rear housing 702 using a plurality of screws.

To support device 700 at an angle, such as at an angle suitable for viewing, a stand 708 is affixed to rear housing 702 using a plurality of screws. In an embodiment, stand 708 is formed of a metallic alloy such as zinc alloy. To prevent sliding of device 700 and to avoid scratching of surfaces upon which device 700 may be placed, a front foot 710 is affixed to a bottom external portion of rear housing 702 and a back foot 712 is affixed to a bottom edge of stand 708. Each of front foot 710 and back foot 712 may comprise an elongated strip of silicon rubber.

A motherboard 906 that supports an embedded microprocessor, associated system controller hub and certain peripherals is disposed within the housing of device 700 in between touch panel/LCD display 904 and a metallic heat sink 908. Both motherboard 906 and heat sink 908 may be affixed to an interior portion of rear housing 702 using a plurality of screws.

Motherboard 906 comprises a USB 2.0 port 1204 that is externally accessible via an opening formed between rear housing 702 and front housing 704 of device 700. Motherboard 906 also comprises an internal plug 1206 that is configured to accept a variety of IEEE 802.11 wireless network adapters, such as an 802.11g wireless network adapter or an 802.11n wireless network adapter. This advantageously allows device 700 to be easily configured during manufacturing to include different types of wireless network adapters or to not include any wireless network adapter at all. By way of example, FIG. 12 shows a configuration in which no wireless network adapter is attached while FIG. 13 shows a configuration in which a wireless network adapter 1302 is attached. Furthermore, since the wireless interface adapters do not comprise a portion of motherboard 906 they can be independently tested and FCC certified prior to incorporation into device 700.

Heat sink 908 operates to absorb and dissipate heat generated by components operating on motherboard 906, by touch panel/LCD display 904 and by components operating on daughterboard 1102 and daughterboard 1104. Such heat may be dissipated through a first plurality of air vents 806 located on an upper portion of rear housing 702. A second plurality of air vents 1208 formed between a bottom portion of rear housing 702 and a bottom portion of front housing 704 facilitates the convective flow of cooler air into the bottom of device 700 and warmer air out the back via first plurality of air vents 806. To increase the surface area over which heat may be dissipated, heat sink 908 comprises a plurality of vertically-extending fins 1008. These fins 1008 also serve to create vertical channels through which warm air can flow up and out of vents 806. No vents are provided at the top of device 700 since such vents could allow dust, liquids or other contaminants to enter the unit and also would be visible to the end user.

In one embodiment, one or more integrated circuit (IC) chips mounted on a rear portion of motherboard 1006 (such as an IC chip corresponding to an embedded microprocessor and an IC chip corresponding to a system controller hub) are thermally connected to heat sink 908 via a layer of silicon heat transfer compound disposed between the IC chip(s) and heat sink 908. This facilitates heat transfer from the IC chip(s) to heat sink 908. Heat sink 908 in turn is thermally connected to metallic stand 708 via another layer of silicon heat transfer compound. This connection is permitted by an opening 1010 in an upper portion of rear housing 702. This facilitates heat transfer from heat sink 908 to stand 708. In accordance with this design, stand 708 advantageously acts both as a physical support and as a heat sink for device 700.

The foregoing heat spreading/dissipation features allow devices internal to device 700 to be kept cool without adding fans or increasing device thickness.

Device 700 further includes first and second speaker mounts 910 within which are housed first and second speakers 912, respectively. First and second speaker mounts 910 are affixed to rear housing 702 using screws. Speaker vents 808 are provided in rear housing 702 to allow sound to emanate from speakers 912 to the outside of device 700. First and second mesh inserts 914 are respectively disposed between first and second speakers 912 and rear housing 702 to dampen the effect of vibration of the speakers on rear housing 702 and to provide a more aesthetically pleasing appearance. A ring of cushioning material such as rubber may also be provided around an outer edge of each of first and second speakers 912 to dampen the effect of vibration of the speakers on first and second speaker mounts 910.

Figure 14:
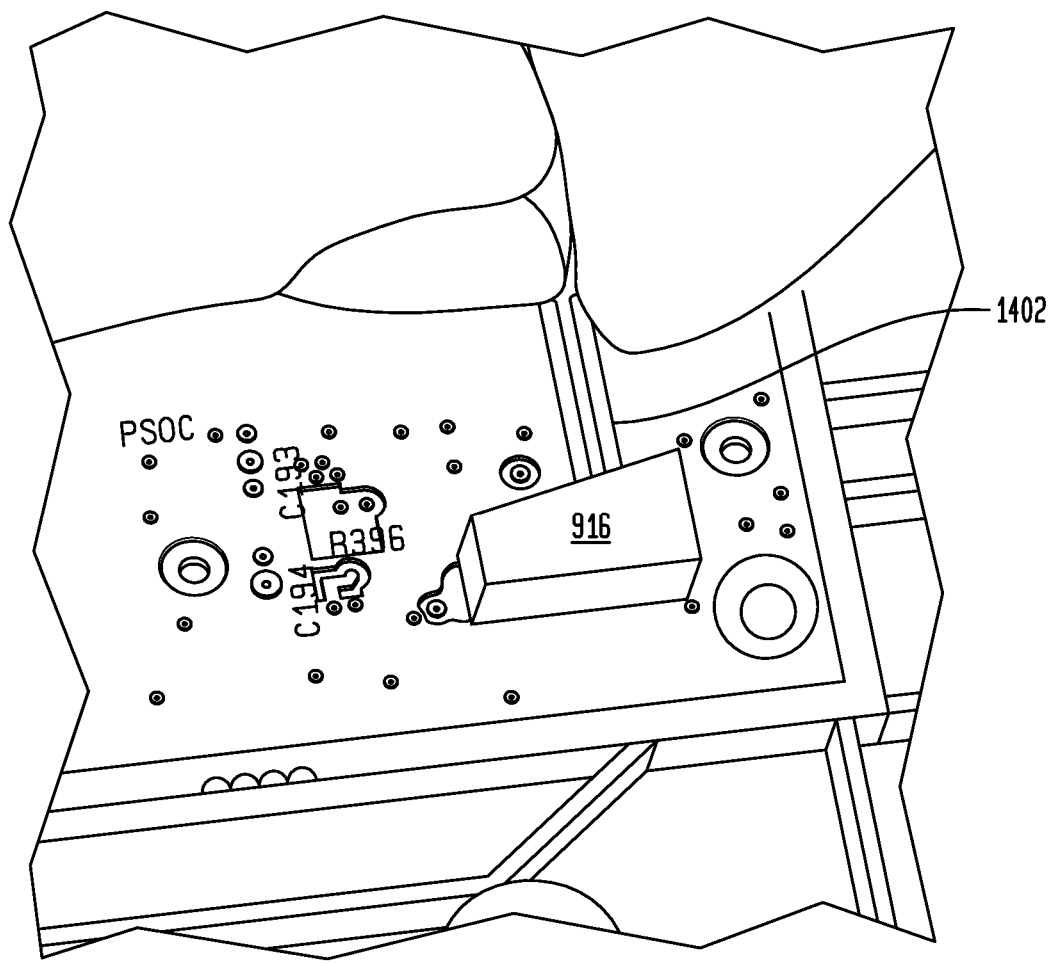
FIG. 14 depicts the insertion of a microphone integrated circuit (IC) located internal to a telephony and digital media services device within a rubber jacket to prevent acoustic echo in accordance with an embodiment of the present invention.

An internal microphone IC 1012 utilized by device 700 is sheathed within a rubber jacket 916 which is then inserted snugly within an enclosure formed on an interior wall of rear housing 702. This serves to isolate microphone IC 1012 from noise generated by first and second speakers 912, which reside in close proximity within the same enclosure, thereby reducing acoustic echo. FIG. 14 depicts microphone IC 1012 inserted within rubber jacket 916, with attached wires 1402 emerging therefrom.

For branding purposes, a label 920 imprinted with text and/or graphical information may be affixed to the back of rear housing 702. For example, label 920 may be affixed to the back of rear housing a pressure sensitive adhesive.

In an embodiment, LCD panel 904 is a panel that accepts video input in the form of 3×8 bit parallel RGB signals plus control signals. The lines that carry such signals can produce relatively high electromagnetic interference (EMI) that can interrupt, obstruct, or otherwise degrade or limit the effective performance of proximally-located electronic circuits. In order to address this, the PSOC controller on daughterboard 1104 is configured to convert LVDS signals which are carried over flexible twisted pair copper cables 1106 from motherboard 906 to RGB signals which are then provided to LCD panel 904 via an RGB interconnect. This has the effect of removing the EMI-producing RGB lines from the motherboard. Furthermore, this allows shortened RGB lines to be used on daughterboard 1104, which reduces an emission source.

LVDS is an interconnect that produces significantly less EMI than RGB for a variety of reasons. For example, LVDS signals swing about 1V peak-to-peak (p-p) while RGB signals swing 3.3 V p-p, so using LVDS reduces current surge produced during a switch. Also, because LVDS signals are differential signals, common mode elements are attenuated. This has the effect of reducing ground bouncing. Additionally, LVDS signals draw more or less constant current, which has the effect of reducing current surge. Furthermore, the number of lines going to an LVDS connector is significantly lower than an RGB connector. This is important because a connector is a source of EMI due to an impedance mismatch.

In addition to the foregoing benefits relating to reducing EMI, LVDS is also less susceptible than RGB to signal degradation over long distances.

In an embodiment, signal lines running through motherboard 906 from an internal microphone to an audio codec may be subject to EMI resulting in degradation of audio signals received from the microphone. In particular, in one embodiment, the audio signals received from the microphone are in microvolts (mV) and thus are very susceptible to board noise such as noise associated with radio frequency (RF) signals, clocks and digital signals. Such noise may couple directly to the microphone signals or to the ground.

Figure 15:
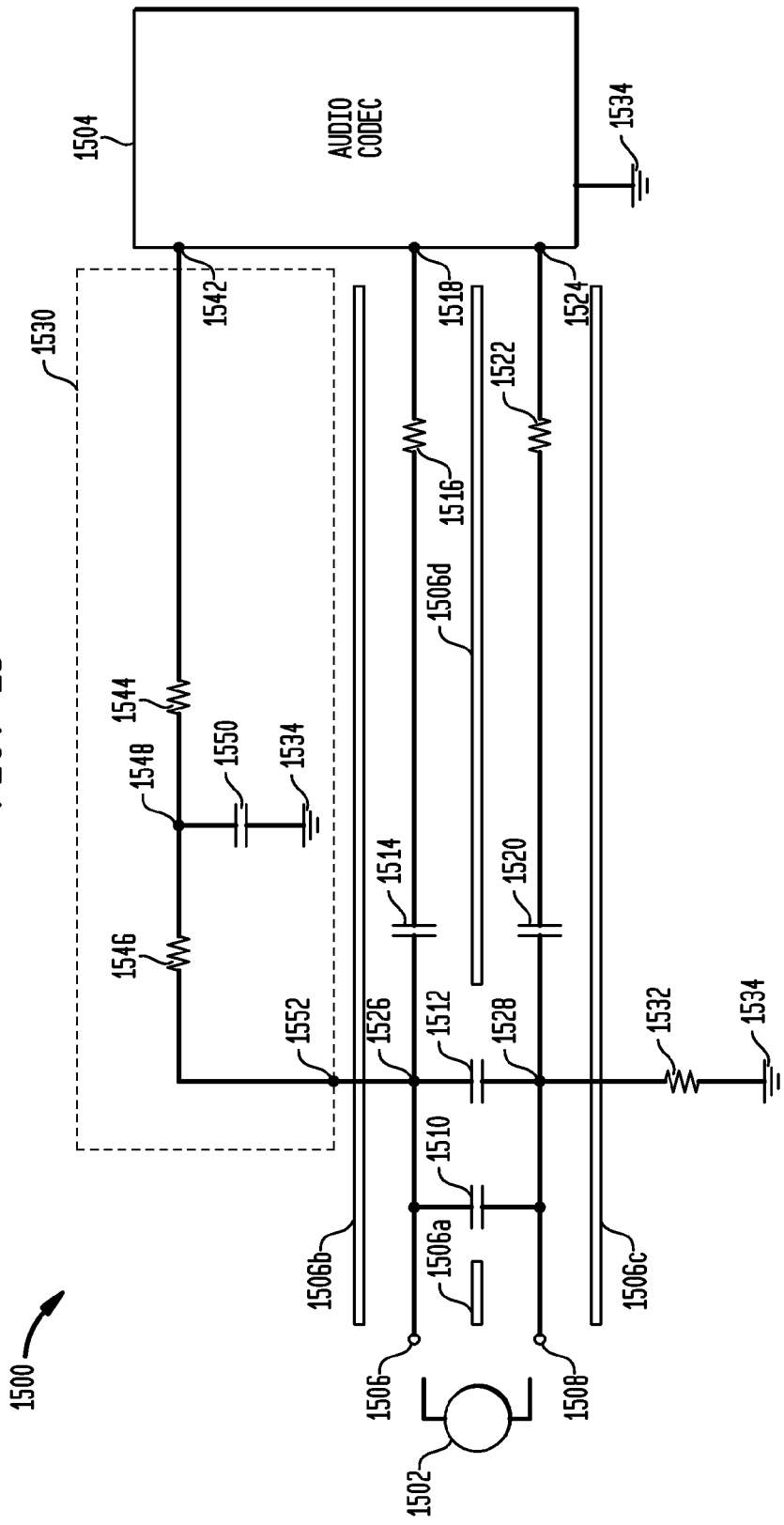
FIG. 15 depicts a microphone circuit that may be used to reduce electromagnetic interference on a printed circuit board internal to a telephony and digital media services device in accordance with an embodiment of the present invention.

FIG. 15 depicts a microphone circuit 1500 that may be used to address this issue in accordance with an embodiment of the present invention. Microphone circuit 1500 comprises a microphone 1502 that is coupled to an audio codec 1504. Both microphone 1502 and audio codec 1504 are mounted on the same printed circuit board (PCB).

As shown in FIG. 15, microphone 1502 produces a differential input signal that is applied to a positive differential input node 1506 and a negative differential input node 1508. A first capacitor 1510 is coupled between positive differential input node 1506 and negative differential input node 1508. In an embodiment, first capacitor 1510 has a capacitance of approximately 0.01 μF. First capacitor 1510 operates in conjunction with an output resistance of microphone 1502 to form a low pass filter that attenuates high frequency digital signals, such as high frequency digital signals produced by other components on the PCB.

A second capacitor 1512 is also coupled between positive differential input node 1506 and negative differential input node 1508. In an embodiment, second capacitor 1512 has a capacitance of approximately 10 pF. Second capacitor 1512 operates to couple the RF signal.

As further shown in FIG. 15, positive differential input node 1506 is connected to a first input 1518 of audio codec 1506 via a serially connected third capacitor 1514 and a first resistor 1516. Likewise, negative differential input node 508 is connected to a second input 1524 of audio codec 1506 via a serially connected fourth capacitor 1520 and a second resistor 1522. In an embodiment, each of third capacitor 1514 and fourth capacitor 520 have a capacitance of approximately 33 nF. Third capacitor 1514 and fourth capacitor 520 operate in conjunction with an input resistance of audio codec 1504 to form a high pass filter that will attenuate low frequency signals such as 60 Hz or 100 Hz signals.

In an embodiment, each of first resistor 1516 and second resistor 1522 have a resistance of approximately 475 ohms First resistor 1516 and second resistor 1522 operate to attenuate RF signals coupled to the differential input signal from microphone 1502. In an embodiment, the input resistance of audio codec 1504 is much greater than the resistance of first resistor 1516 and second resistor 1522 such that attenuation of the differential input signal from microphone 1502 is minimized.

As further shown in FIG. 15, a first terminal 1526 of second capacitor 1512 is coupled to an output node 1552 of a bias signal generation circuit 1530. A second terminal 1528 of second capacitor 1512 is connected to ground 1534 via a third resistor 1532. In one embodiment, third resistor 1532 has a resistance of approximately 1.5 kilohms (K).

Bias signal generation circuit 1530 comprises a node 1548 that is coupled to an output 1542 of audio codec 1504 to which a microphone bias signal is applied. Node 1548 is connected to output 1542 via a fourth resistor 1544. Node 1548 is also coupled to ground 1534 via a fourth capacitor 1550. Output node 1552 of bias signal generation circuit 1530 is connected to node 1548 via a fifth resistor 1546. In an embodiment, fourth resistor 1544 has a resistance of approximately 1 K, fourth capacitor 1550 has a capacitance of approximately 10 μF, and fifth resistor 1546 has a resistance of approximately 1.21 K.

As shown in FIG. 15, the differential input of microphone 1502, bias signal generation circuit 1530 and audio codec 1504 are all coupled to the same ground 1534, which is intended to represent a ground near or in audio codec 1504.

As further shown in FIG. 15, ground shields 1506*a*, 1506*b*, 1506*c* and 1506*d* are placed around the positive and negative differential signals connected from microphone 1502 to audio codec 1504 to avoid digital ground noise being coupled to those signals. In an embodiment, each of ground shields 1506*a*, 1506*b*, 1506*c* and 1506*d* comprises a trace that is connected to ground 1534 near or in audio codec 1504.

Figure 16:
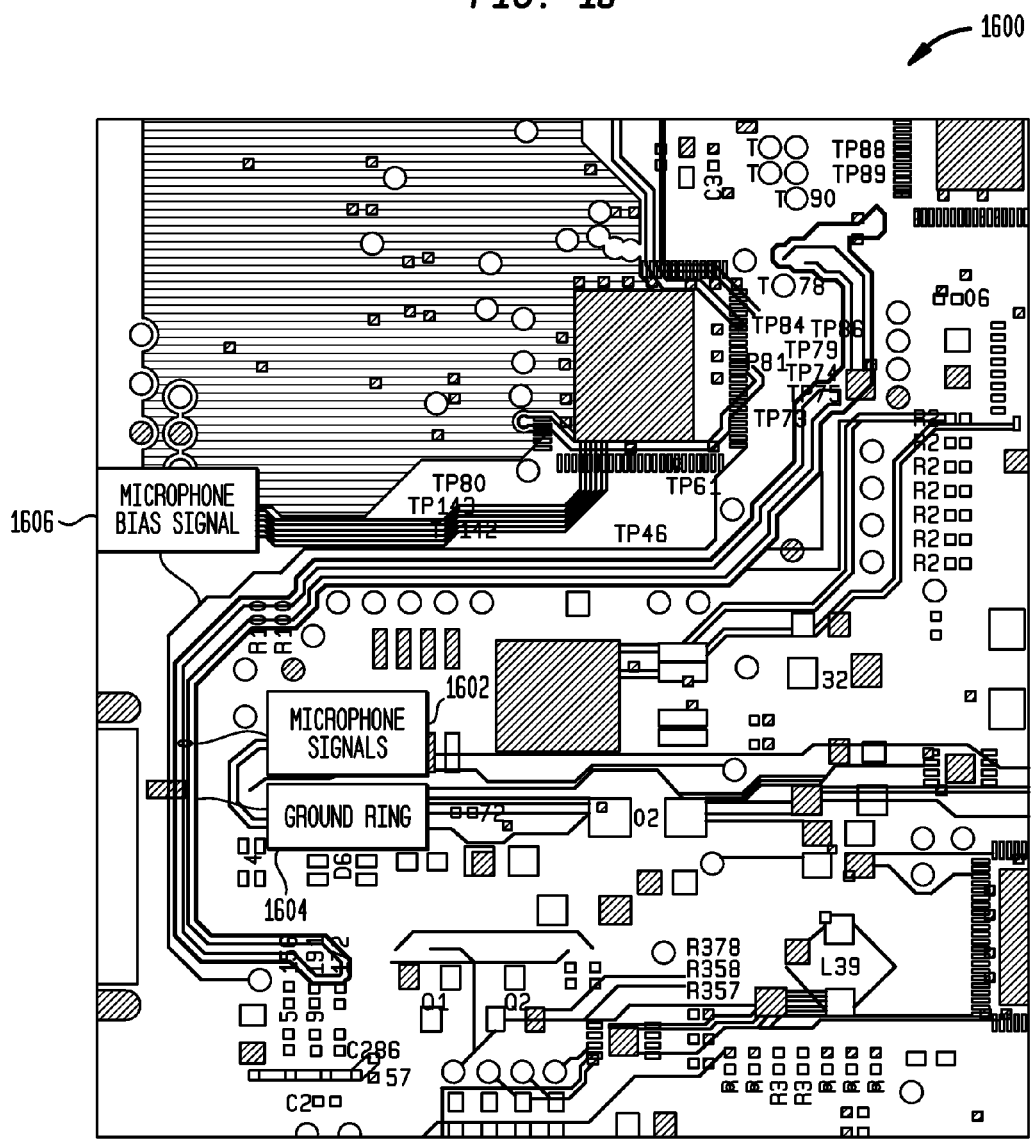
FIG. 16 depicts an example printed circuit board in accordance with an embodiment of the present invention in which ground shields are used to avoid coupling of digital ground noise to microphone signals.

FIG. 16 depicts an example PCB 1600 in which ground shields are used to avoid coupling of digital ground noise to microphone signals in accordance with an embodiment of the present invention. In particular, in PCB 1600, microphone signals are carried by two signal traces 1602 that are isolated from noise generated by other board components by a ground ring 1604 that surrounds traces 1602. A trace 1606 that carries a microphone bias signal is also shown. Because trace 1606 is also in close proximity to ground ring 1604, it also receives some shielding from it.

III.B. Alternative Device/Handset Designs

The foregoing design details were provided by way of example only and various other designs may be used to implement a telephony and digital media services device in accordance with embodiments of the present invention. Various handset designs other than those described above may also be used.

Figure 17:
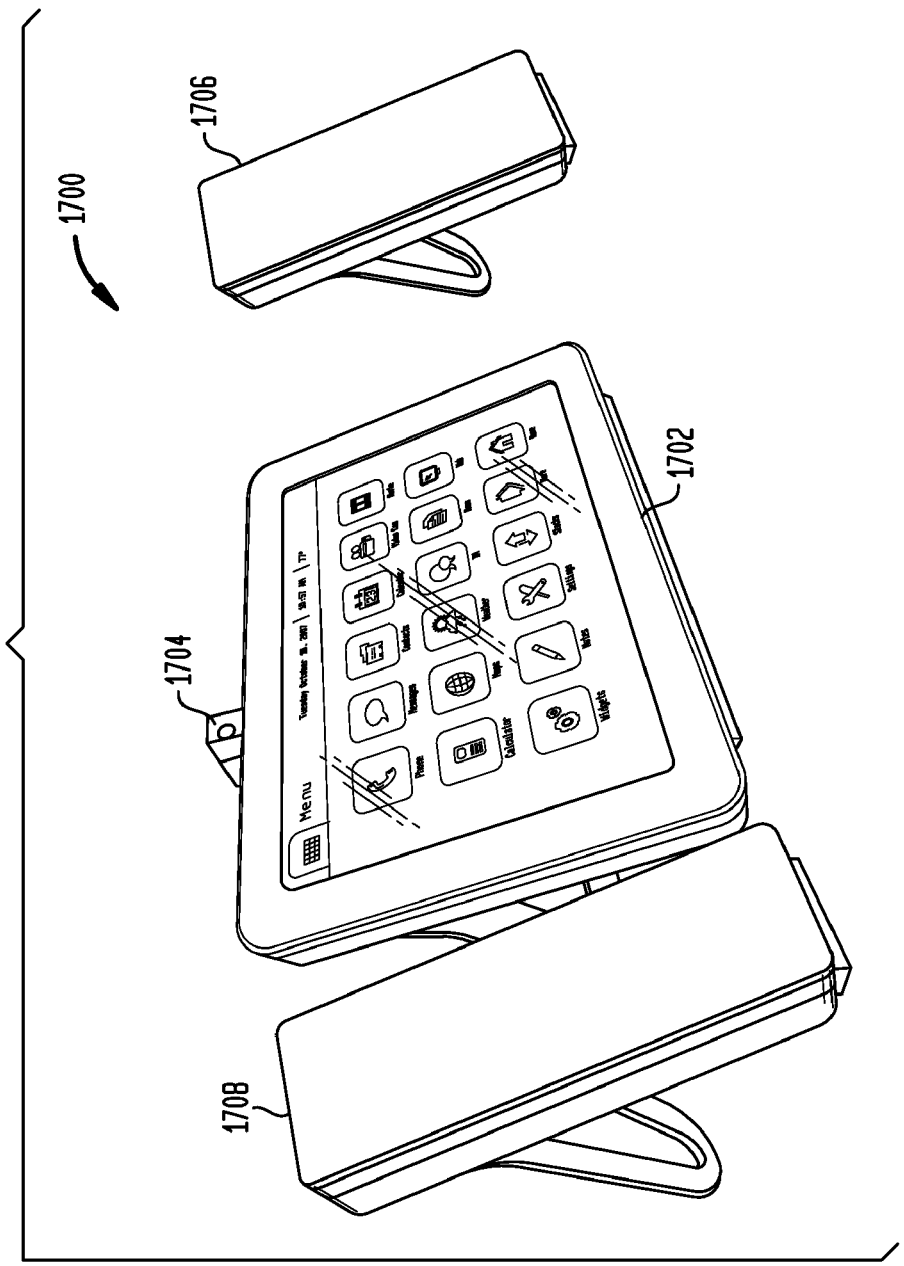
FIG. 17 depicts a system in accordance with an embodiment of the present invention that includes a device that includes an integrated camera and that may be coupled through an external audio jack to a pair of associated speakers.

For example, as shown in FIG. 17, a system 1700 in accordance with an embodiment of the present invention may include a device 1702 that includes an integrated camera 1704 for use in applications such as video messaging and video conferencing. Device 1702 may also be coupled through an external audio jack to a pair of associated speakers 1706 and 708 for more robust audio performance.

Figure 18:
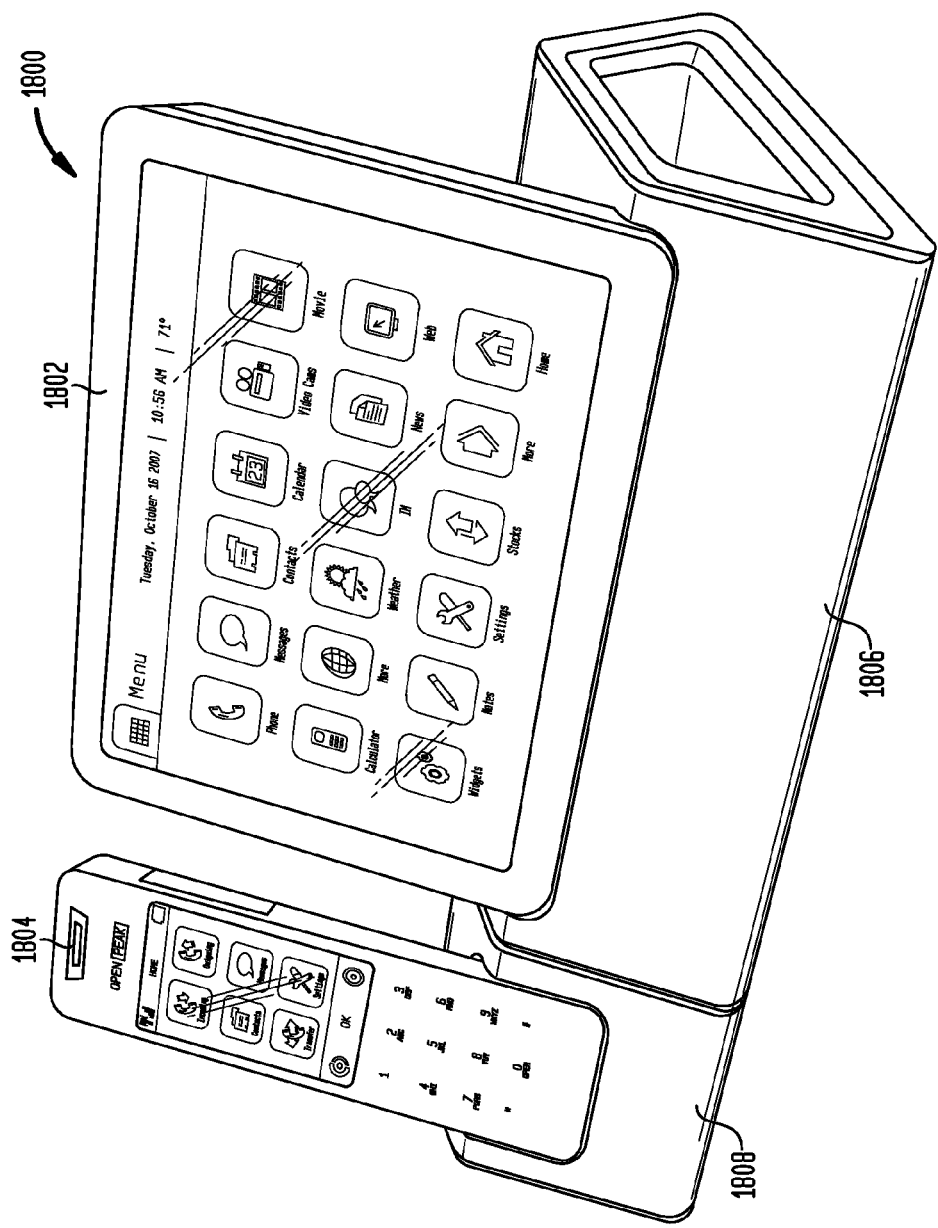
FIGS. 18 and 19 depict a system in accordance with an embodiment of the present invention that includes a modular device and associated handset each of which may be inserted in or removed from a corresponding docking station.
Figure 19:
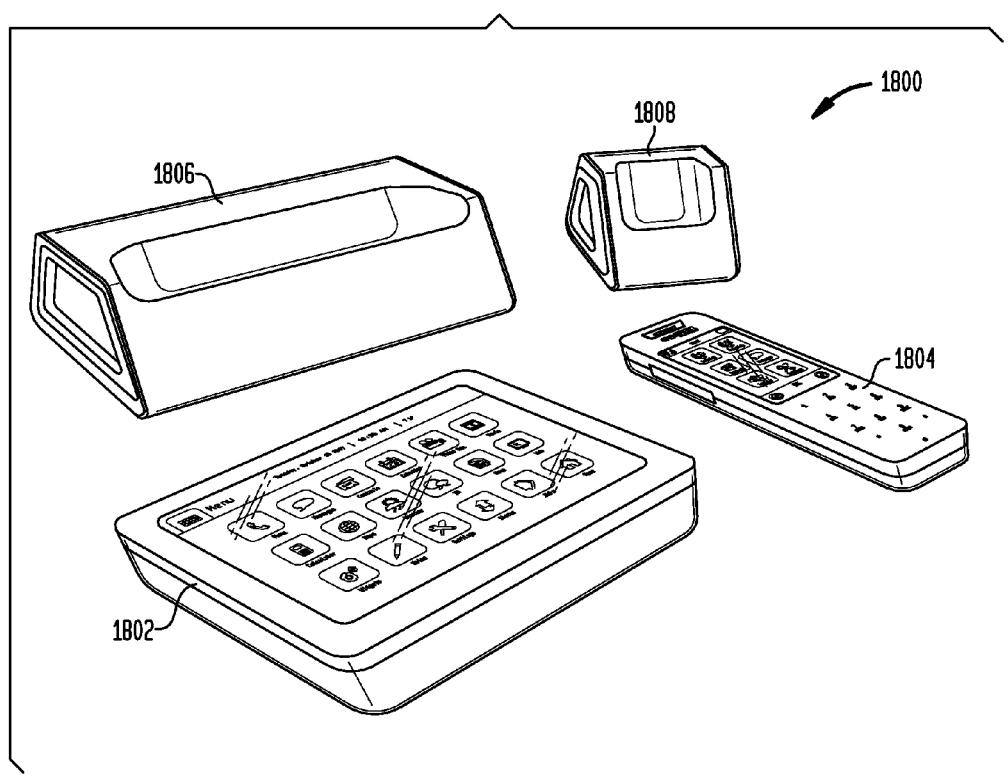

FIG. 18 depicts a system 1800 in accordance with an embodiment of the present invention that includes a device 1802 and associated handset 1804 each of which may be inserted in and removed from a respective modular docking station 1806 and 1808. FIG. 18 shows device 1802 and handset 1804 in a docked position while FIG. 19 shows the same components in an undocked position. Handset docking station 1808 may be powered by an AC adapter and may provide an interface by which a battery internal to handset 1804 can be recharged. Likewise, docking station 1806 may be powered by an AC adapter and provide an interface by which a battery internal to device 1802 may be recharged. The ability to remove and carry device 1802 in an untethered manner while running on battery power may be desirable to end users of device 1802.

The modular design of docking station 1806 and 1808 may allow such components to snap together. Furthermore, depending upon the implementation, docking station 1806 and 1808 may be configured to share a single power connector that is connected to one of the docking stations.

Handset 1804 is implemented using an ultra-thin design and utilizes a capacitive touch keypad and display.

Figure 20:
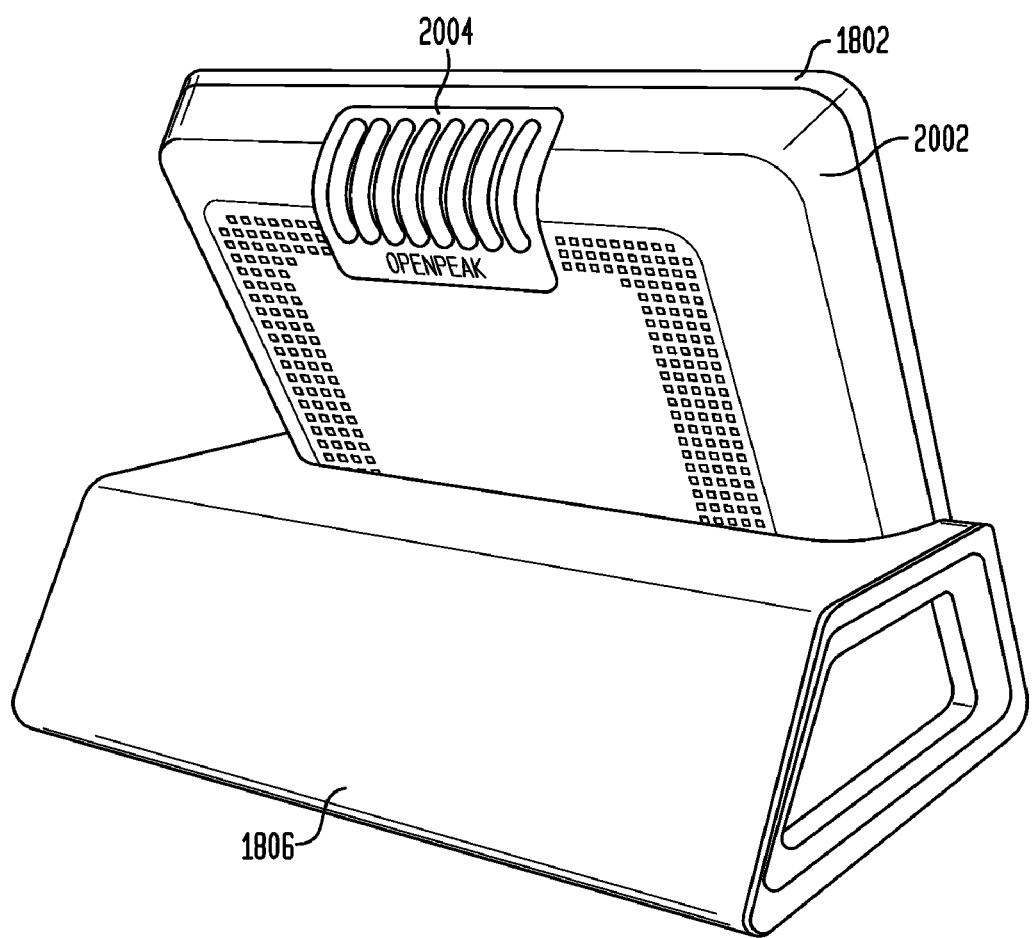
FIG. 20 is a back perspective view of the device shown in FIGS. 18 and 19.

FIG. 20 is a back perspective view of device 1802 and docking station 1806. As shown in FIG. 20, device 1802 is fully supported for angular viewing when docked in docking station 1806 and thus does not require a stand, such as stand 708 described above in reference to device 700. However, device 1802 may include a metallic badge 2004 that is connected to a rear housing 2002 of device 1802 and that includes information imprinted thereon, such as branding text and/or graphics. Furthermore, rear housing 2002 may include an opening by which badge 2004 can be thermally connected to a heat sink located internally with respect to device 1802, thereby allowing badge 2004 to act as an external heat sink for device 1802. Badge 2004 may be thermally connected to the internal heat sink, for example, by a layer of silicon heat transfer compound.

Figure 21:
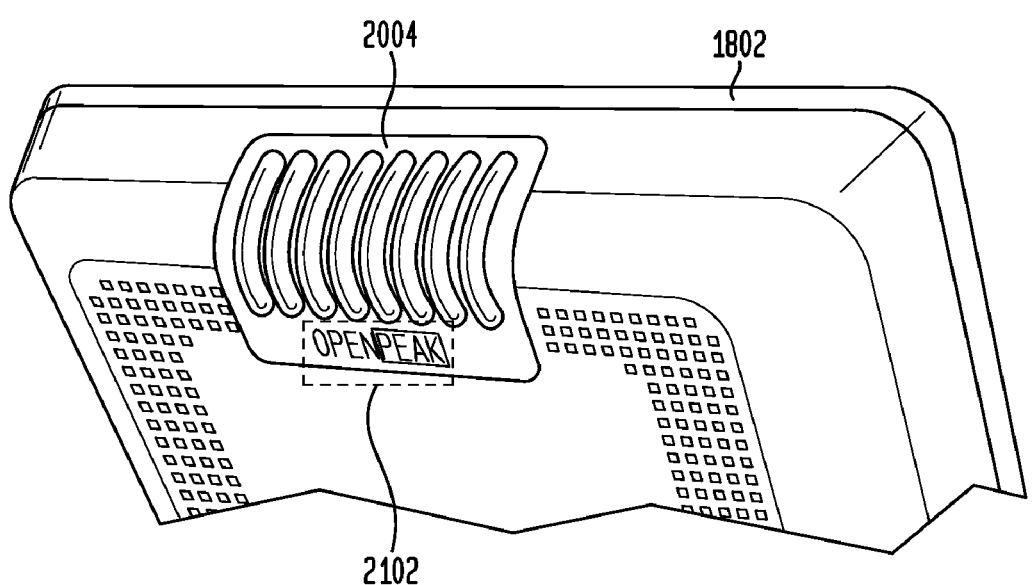
FIG. 21 is a partial back perspective view of the device shown in FIGS. 18 and 19.

FIG. 21 is a partial back perspective view of device 1802 that provides an improved view of branding information 2102 located on badge 2004.

Figure 22:
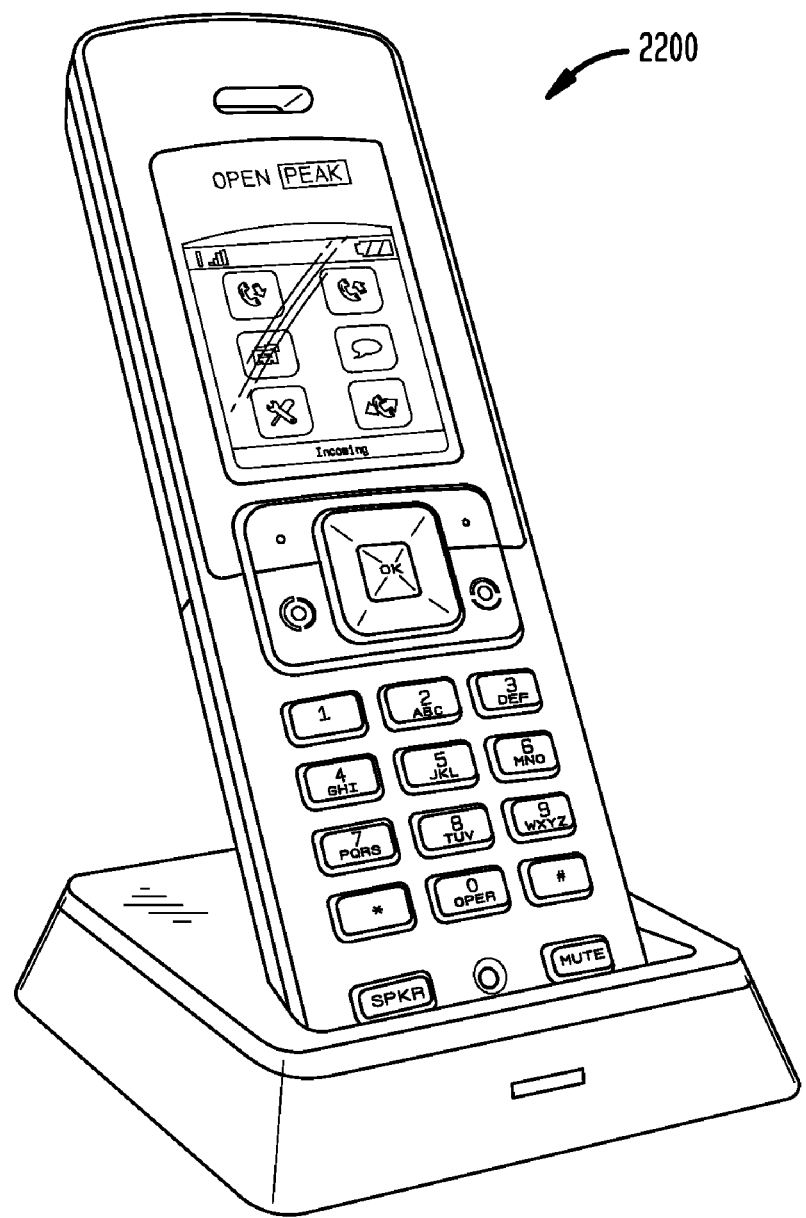
FIGS. 22, 23 and 24 depict different handsets in accordance with various embodiments of the present invention.
Figure 23:
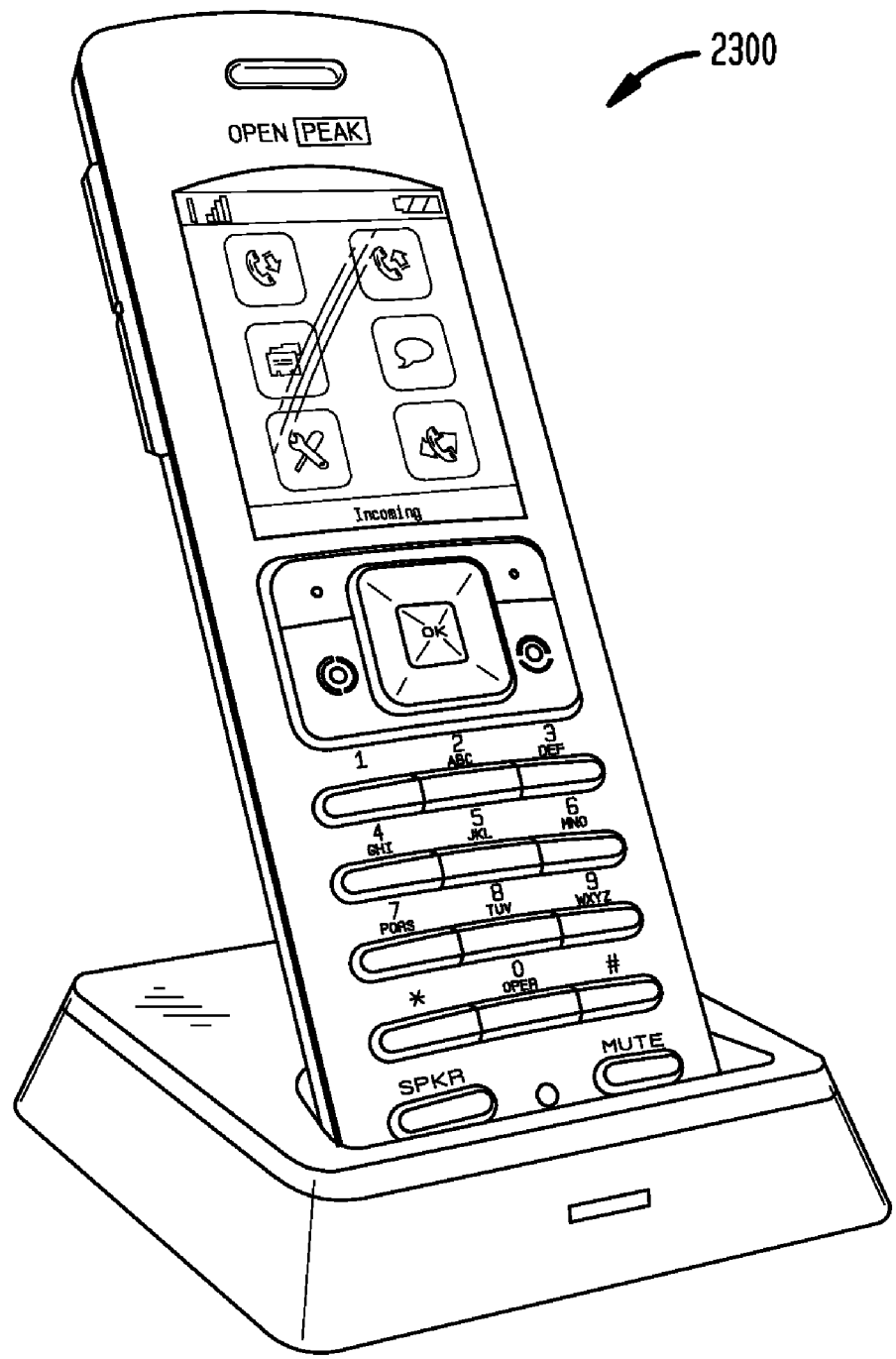
Figure 24:
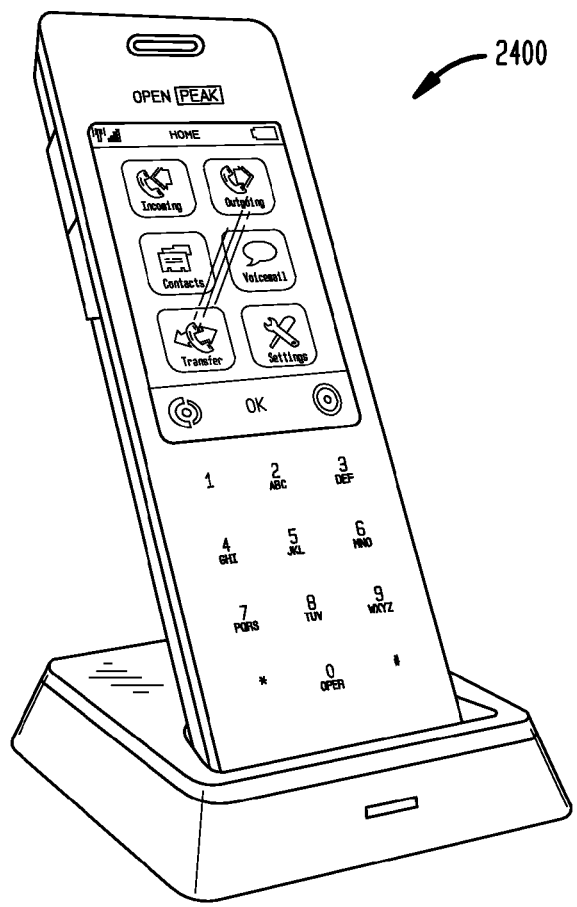
Figure 25:
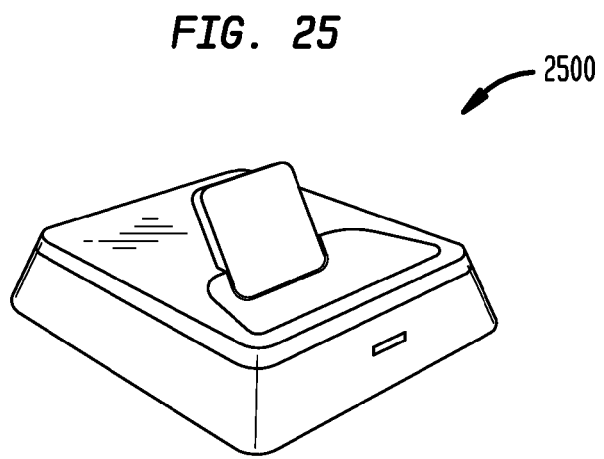
FIG. 25 shows a handset docking station in accordance with an embodiment of the present invention.

FIGS. 22, 23 and 24 depicts different handsets 2200, 2300 and 2400, respectively, in accordance with various embodiments of the present invention. Handset 2400 incorporates a capacitive touch keypad and display. FIG. 25 depicts an example handset docking station 2500 in accordance with an embodiment of the present invention.

Figure 26:
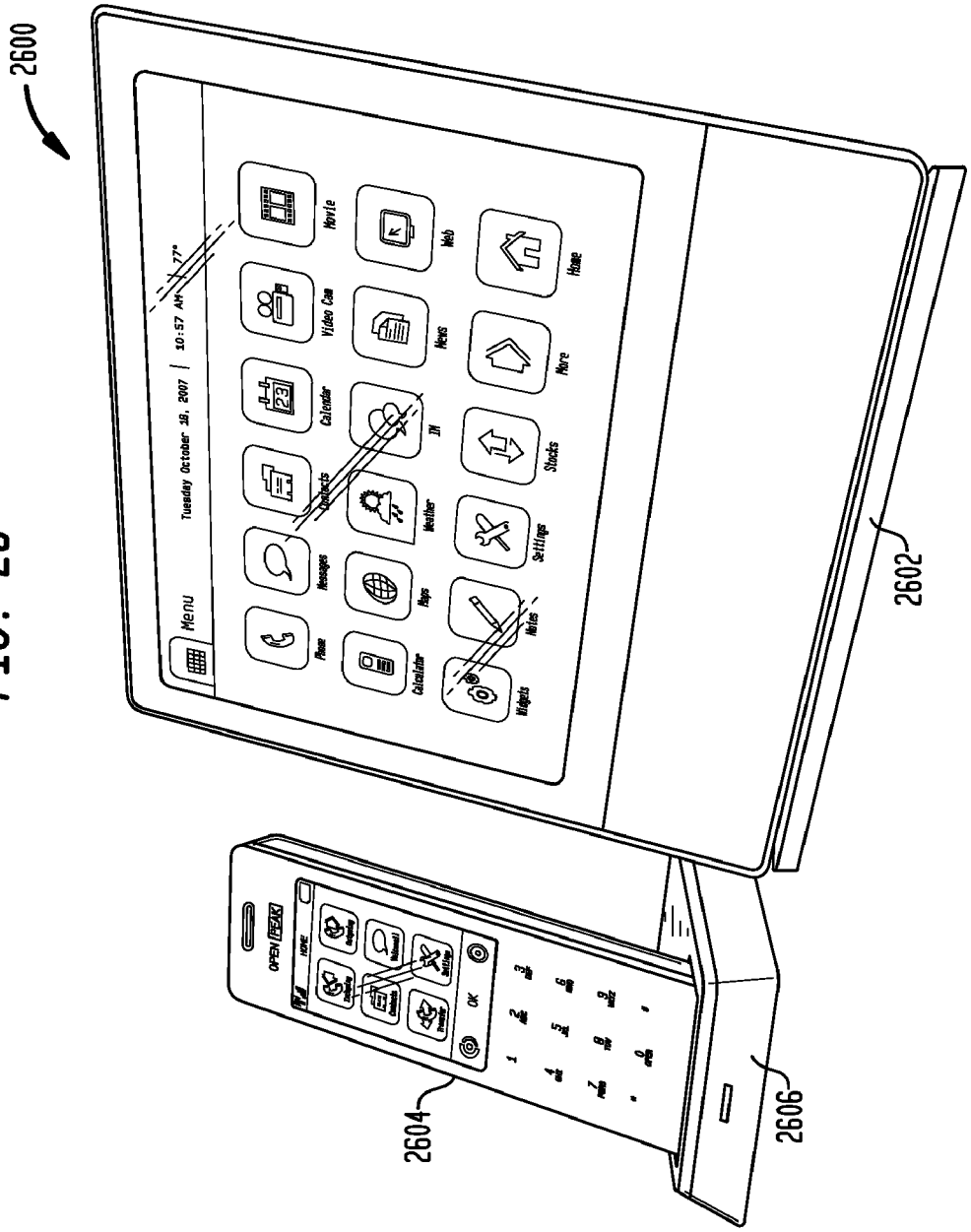
FIG. 26 depicts a system in accordance with an embodiment of the present invention that comprises a thin profile device with an associated handset and cradle combination.

FIG. 26 depicts a system 2600 comprising a thin profile device 2602 with an associated handset 2604 and cradle 2606 combination. Device 604 includes one or more integrated front facing speakers for an improved media experience.

Figure 27:
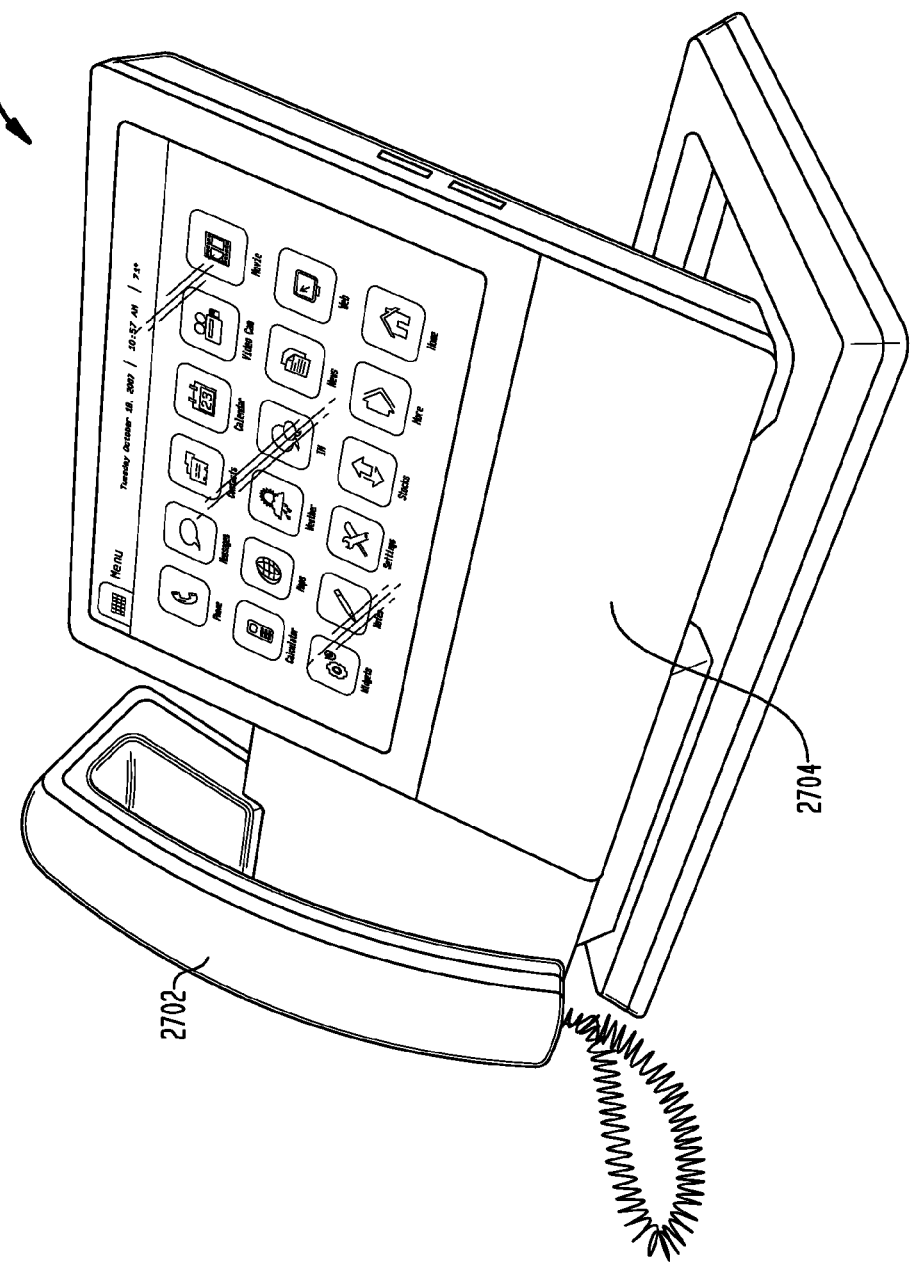
FIG. 27 depicts an alternative device in accordance with an embodiment of the present invention that includes an integrated wired handset and front-facing speaker(s).

FIG. 27 depicts an alternative device 2700 that may be used, for example, in office environments. As shown in FIG. 27, device 2700 includes an integrated wired handset 2702 and front-facing speaker(s) 2704.

Figure 28:
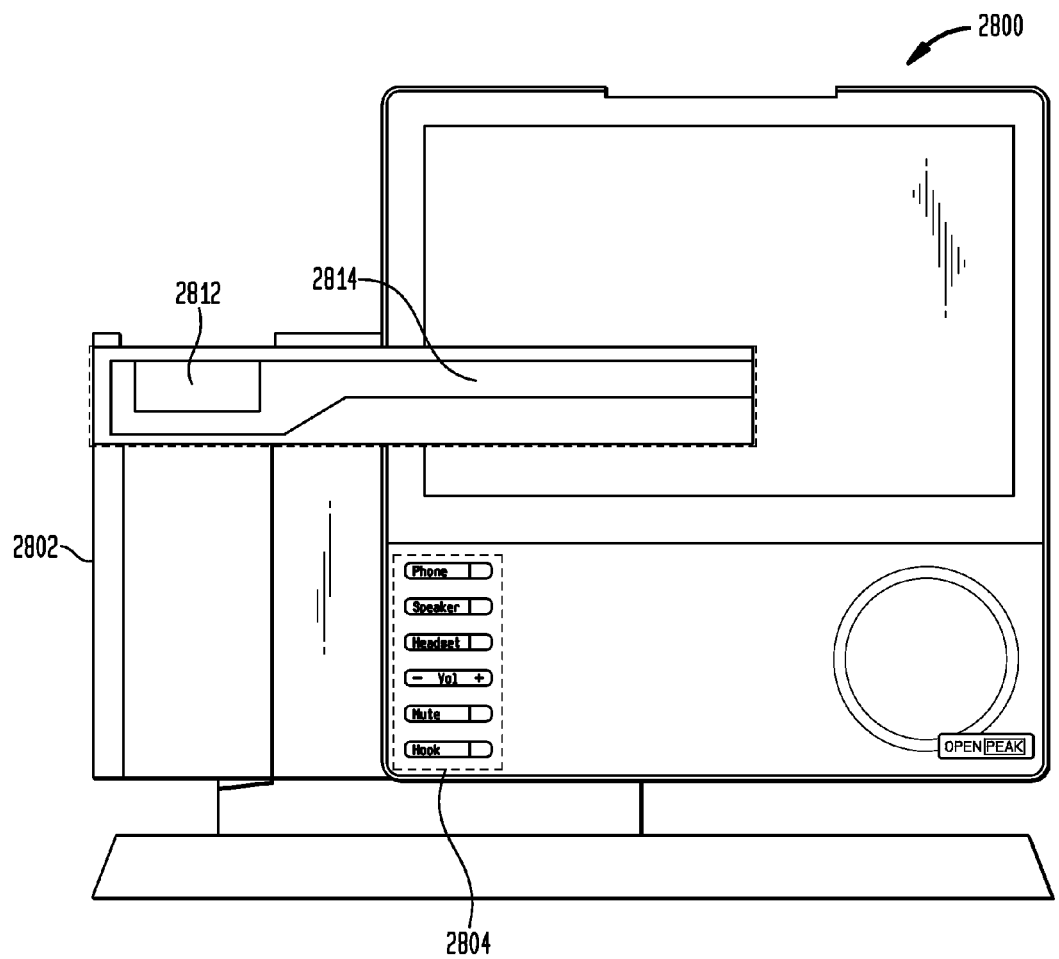
FIG. 28 depicts a device in accordance with an embodiment of the present invention that incorporates a capacitive touch sensor into a handset cradle to detect on-hook and off-hook events.

FIG. 28 depicts another device 2800. As shown in FIG. 28, device 2800 includes a handset cradle 2802 that is designed to accommodate a handset (not shown) when the handset is not in use. As further shown in FIG. 28, underneath a plastic surface of handset cradle 2802 resides a capacitive touch sensor 2812 that is connected to a receiver on a PCB internal to device 2800 via a connector 2814. Capacitive touch sensor 2812 is configured to sense the proximity of the handset or other objects (such as a human finger) to the cradle. When such proximity is detected, sensor 2812 sends a signal to the receiver internal to device 2800. The receiver in turn alerts an internal processor that generates an on-hook or off-hook event responsive to the sensor signal. This allows on-hook and off-hook functionality of device 2800 to be implemented without using a mechanical button as used in many traditional phones.

Figure 29:
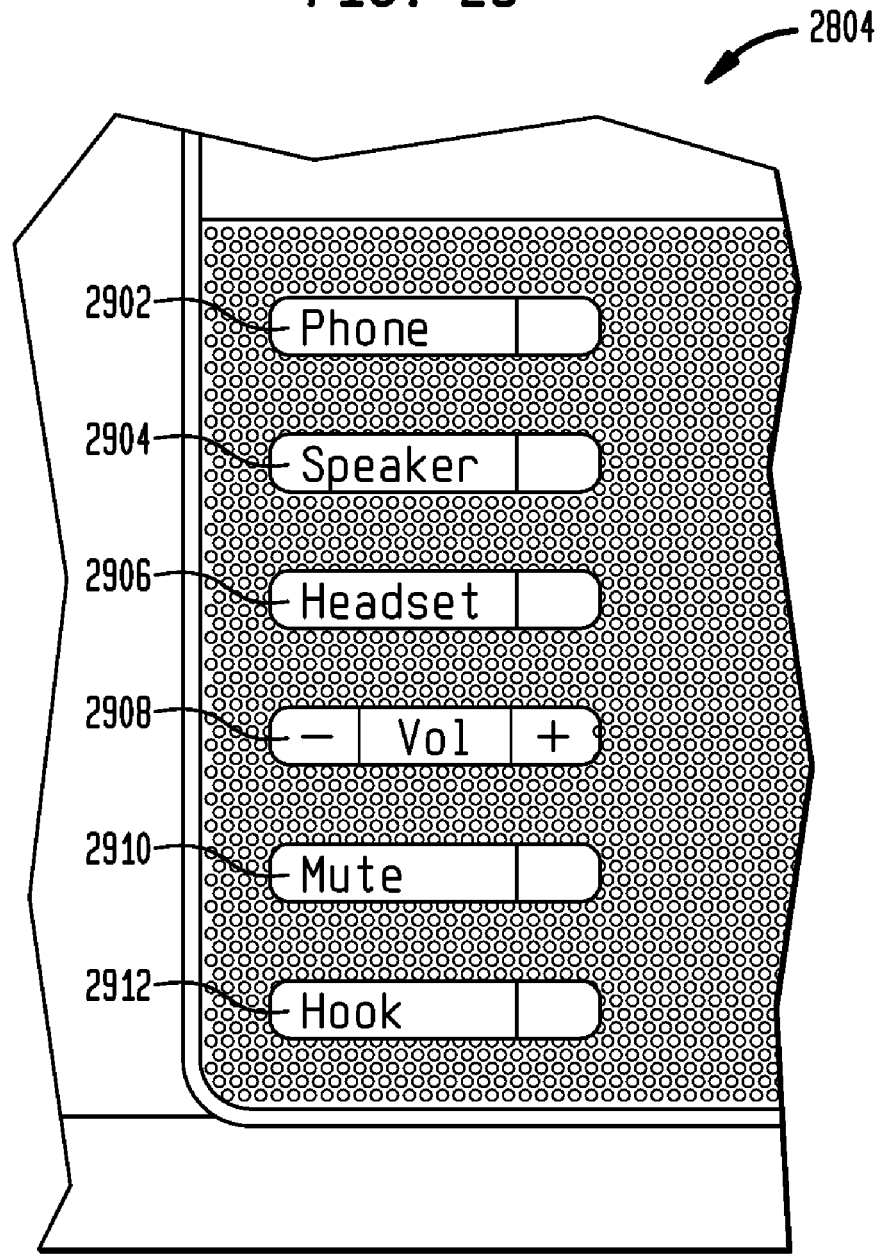
FIG. 29 illustrates a plurality of telephony control buttons that may be implemented on the device of FIG. 28 using capacitive touch sensing technology.

As shown in FIG. 28, device 2800 also includes a plurality of telephony control button 2804 that may be implemented using capacitive touch sensing technology. In accordance with such an implementation, capacitive touch sensors corresponding to each button are physically located beneath each button and are connected to an internal processor to register sensed user touches. Such buttons are shown in larger form in FIG. 29. As shown in that figure, buttons 2804 include a phone button 2902, a speakerphone button 2904, a headset button 2906, a volume control button 2908, a mute button 2910 and an on-hook/off-hook button 2912.

IV. Conclusion

While various embodiments of the present invention have been described above, it should be understood that they have been presented by way of example only, and not limitation. It will be understood by those skilled in the relevant art(s) that various changes in form and details may be made therein without departing from the spirit and scope of the invention as defined in the appended claims. Accordingly, the breadth and scope of the present invention should not be limited by any of the above-described exemplary embodiments, but should be defined only in accordance with the following claims and their equivalents.

What is claimed is:

1. An electronic device comprising:
a housing;
a printed circuit board disposed internal to the housing that supports at least one integrated circuit (IC) chip;
a first heat sink disposed internal to the housing that is thermally connected to the at least one IC chip; and
a second heat sink connected to the housing such that at least a portion thereof is externally disposed to the housing and is unenclosed by any other device housing, the second heat sink being thermally connected to the first heat sink via an aperture in the housing,
wherein the second heat sink comprises a metallic stand that is connected to an external portion of the housing and that provides physical support for the electronic device when placed on a surface.

2. The device of claim 1, wherein the first heat sink is thermally connected to the at least one IC chip via a layer of silicon heat transfer compound.

3. The device of claim 1, wherein the second heat sink is thermally connected to the first heat sink via a layer of silicon heat transfer compound.

4. The device of claim 1, wherein the first heat sink comprises a metallic heat sink.

5. The device of claim 1, wherein the metallic stand is connected to a rear external portion of the housing.

6. A method for manufacturing an electronic device, comprising:
providing a housing;
disposing a printed circuit board that supports at least one integrated circuit (IC) chip internal to the housing;
disposing a first heat sink internal to the housing that is thermally connected to the at least one IC chip; and
connecting a second heat sink to the housing such that at least a portion of the second heat sink is externally disposed to the housing and is unenclosed by any other device housing, the second heat sink being thermally connected to the first heat sink via an aperture in the housing,
wherein connecting the second heat sink to the housing comprises connecting a metallic stand that provides physical support for the electronic device when placed on a surface to an external portion of the housing.

7. The method of claim 6, wherein the first heat sink is thermally connected to the at least one IC chip via a layer of silicon heat transfer compound.

8. The method of claim 6, wherein the second heat sink is thermally connected to the first heat sink via a layer of silicon heat transfer compound.

9. The method of claim 6, wherein disposing the first heat sink internal to the housing comprises disposing a metallic heat sink internal to the housing.

10. The method of claim 6, wherein connecting the metallic stand to an external portion of the housing comprises connecting the metallic stand to a rear external portion of the housing.

11. An electronic device comprising:
a housing;
a printed circuit board disposed internal to the housing that supports at least one integrated circuit (IC) chip;
a first heat sink disposed internal to the housing that is thermally connected to the at least one IC chip; and
a second heat sink disposed in an open air environment and thermally connected to the first heat sink via an aperture in the housing, the second heat sink comprising a metallic stand that is connected to an external portion of the housing and that provides physical support for the electronic device when placed on a surface.

12. An electronic device comprising:
a housing;
a printed circuit board disposed internal to the housing that supports at least one integrated circuit (IC) chip;
a first heat sink disposed internal to the housing that is thermally connected to the at least one IC chip; and
a second heat sink connected to the housing such that at least a portion thereof is externally disposed to the housing, the second heat sink being irremovably affixed to the first heat sink via an aperture in the housing, the second heat sink comprising a metallic stand that is connected to an external portion of the housing and that provides physical support for the electronic device when placed on a surface.

* * * * *